United States Patent
Ker et al.

(10) Patent No.: US 6,249,410 B1
(45) Date of Patent: Jun. 19, 2001

(54) ESD PROTECTION CIRCUIT WITHOUT OVERSTRESS GATE-DRIVEN EFFECT

(75) Inventors: Ming-Dou Ker, Hsinchu; Hun-Hsien Chang, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/378,948

(22) Filed: Aug. 23, 1999

(51) Int. Cl.$^7$ ........................................................ H02H 3/22
(52) U.S. Cl. .............................................. 361/56; 361/111
(58) Field of Search .............................. 361/56, 118, 111, 361/119

(56) References Cited

U.S. PATENT DOCUMENTS

| | | | |
|---|---|---|---|
| 4,855,620 | 8/1989 | Duvvury et al. | 307/448 |
| 4,937,700 | * 6/1990 | Iwahashi | 361/56 |
| 5,086,365 | 2/1992 | Lien | 361/58 |
| 5,237,395 | 8/1993 | Lee | 257/358 |
| 5,255,146 | 10/1993 | Miller | 361/56 |
| 5,287,241 | 2/1994 | Puar | 361/56 |
| 5,311,391 | 5/1994 | Dungan et al. | 361/56 |
| 5,440,162 | 8/1995 | Worley et al. | 257/355 |
| 5,500,546 | * 3/1996 | Marum et al. | 257/358 |

(List continued on next page.)

OTHER PUBLICATIONS

S.G. Beebe, "Methodology for Layout Design and Optimization of ESD Protection Transistors", 1996 EOS/ESD Symp. Proc. pp. 265–275.

T. L. Polgreen et al., Improving the ESD Failure Threshold of Silicided n–MOS Output Transistors by Ensuring Uniform Current Flow, IEEE Trans. Electron Devices, vol. 39, pp. 379–388, 1992.

C. Duvvury et al., "Dynamic Gate Coupling of NMOS for Efficient Output ESD Protection", Proc. of IRPS, 1992, pp. 141–150.

C. Duvvury et al. "Achieving Uniform nMOS Device Power Distribution for Submicron ESD Reliability", Tech. DigIEDM, 1992, pp. 131–134.

Ramaswamy et al., "EOS/ESD Reliability of Deep Sub–Micron NMOS Protection Devices," Proc. of IRPS, 1995, pp. 284–291.

(List continued on next page.)

Primary Examiner—Josie Ballato
(74) Attorney, Agent, or Firm—George O. Saile; Stephen B. Ackerma; Billy Knowles

(57) ABSTRACT

An ESD protection circuit is connected to an integrated circuit to dissipate an electrostatic charge from an ESD source placed in contact with two terminals of the integrated circuit to prevent damage to the integrated circuits. The ESD protection circuit has a ESD shunting circuit for shunting the electrostatic charge from integrated circuit. The ESD shunting circuit has a first port connected to one terminal of the integrated circuit, a second port connected to another terminal of the integrated circuit, and a third port. The ESD protection circuit additionally has an ESD detection circuit. The ESD detection circuit has a first input port connected to the one terminal of the integrated circuit, a second input port connected to the other terminal of the integrated circuit, and an output port connected to the third port of the ESD shunting circuit. When the ESD detection circuit detects the presence of the electrostatic charge from the ESD source, the ESD detection circuit generates an excess voltage at the third port that will damage the ESD shunting circuit. Finally The ESD protection circuit has a voltage clamping circuit connected between the third port of the ESD shunting circuit and one of the terminals of the integrated circuit to prevent the generation of the excess voltage at the third port of the ESD shunting circuit.

38 Claims, 21 Drawing Sheets

U.S. PATENT DOCUMENTS

| | | | |
|---|---|---|---|
| 5,598,313 | * | 1/1997 | Gersbach .............................. 361/56 |
| 5,610,791 | | 3/1997 | Voldman .............................. 361/56 |
| 5,625,280 | | 4/1997 | Voldman ............................ 323/284 |
| 5,631,793 | | 5/1997 | Ker et al. ............................. 361/56 |
| 5,774,318 | * | 7/1998 | McClure et al. ...................... 361/56 |
| 5,784,242 | * | 7/1998 | Watt .................................... 361/111 |
| 5,825,603 | * | 10/1998 | Parat et al. .......................... 361/111 |
| 5,835,328 | * | 11/1998 | Maloney et al. .................... 361/111 |
| 5,946,175 | * | 8/1999 | Yu ........................................ 361/56 |
| 5,956,219 | * | 9/1999 | Maloney .............................. 361/56 |
| 5,959,488 | * | 9/1999 | Lin et al. ............................ 327/313 |
| 5,959,820 | * | 9/1999 | Ker et al. ........................... 361/111 |
| 6,172,383 | * | 1/2001 | Williams ............................ 257/173 |

OTHER PUBLICATIONS

M.D. Ker et al., "Capacitor–Couple ESD Protection Circuit for Deep–Submicron Low–Voltage CMOS ASIC," IEEE Trans. on VLSI Systems, vol. 4, pp. 307–321, Sep. 1996.

M. D. Ker, "Whole–Chip ESD Protection Design With Efficient VDD–to–VSS ESD Clamp Circuits for Submicron CMOS VLSI," IEEE Trans. on Electron Devices, vol. 46, No. 1, pp. 173–178, Jan., 1999 (M. D. Ker ED 46).

Merrill et al., "ESD Design Methodology," EOS/ESD Symp. Proc, 1993, EOS–15, pp. 233–237.

S. Dabral et al., "Core Clamps for Low Voltage Technologies," EOS/ESD Symp. Proc., 1994, EOS–16, pp. 141–149.

Worley et al., "Sub–Micron Chip ESD Protection Schemes Which Avoid Avalanching Junctions", EOS/ESD Symp. Proc., 1995, EOS–17, pp. 13–20.

Voldman et al., "Scaling, Optimization and Design Considerations of Electrostatic Discharge Protection Circuits in CMOS Technology", EOS/ESD Symp. Proc., pp. 251–260, 1993.

Amerasekera et al., "The Impact of Technology Scaling of ESD Robustness and Protection Circuit Design", EOS/ESD Symp. Proc., pp. 237–245, 1994.

S. Daniels et al., "Process and Design Optimization for Advanced CMOS I/O ESD Protection Devices", EOS/ESD Symp. Proc., pp. 206–213, 1990.

Amerasekera et al., "Substrate Triggering and Salicide Effects on ESD Performance and Protection Circuit Design in Deep Submicron CMOS Processes", IEDM Tech. Dig., 1995, pp. 547–550.

J. Chen et al., "Design Methodology for Optimizing Gate Driven ESD Protection Circuits in Submicron CMOS Processes," Proc. of EOS/ESD Sym., pp. 230–239, 1977.

J. Chen et al., "Design Methodology and Optimization of Gate–Driven NMOS ESD Protection Circuits in Submicron CMOS Processes," IEEE Trans, on Electron Devices, vol. 45, No. 12, pp. 2448–2456, Dec. 1998.

W. Anderson et al., "ESD Protection for Mixed–Voltage I/O Using NMOS Transistors Stacked in a Cascode Configuration", Proc. of EOS/ESD Symp., pp. 54–62, 1998.

* cited by examiner

FIG. 1 – Prior Art

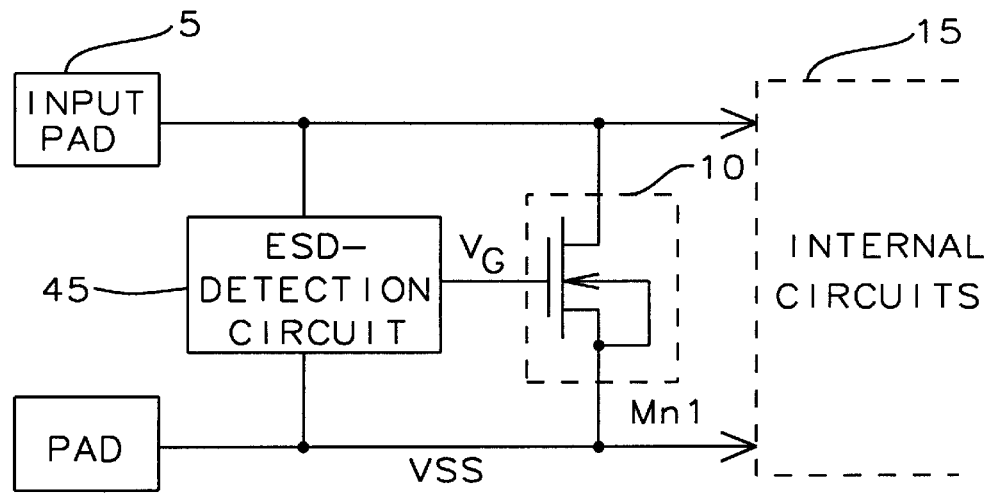
*FIG. 3 - Prior Art*
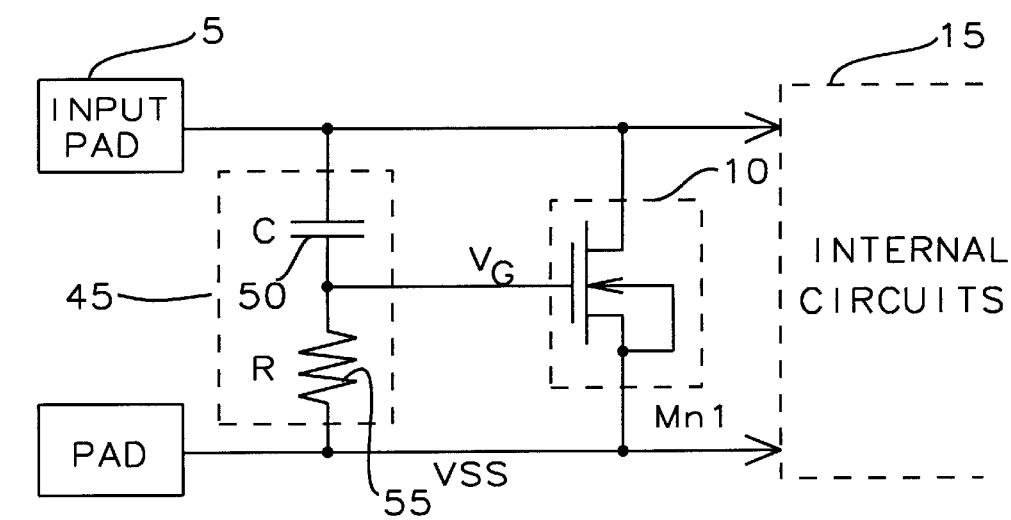
*FIG. 4 - Prior Art*

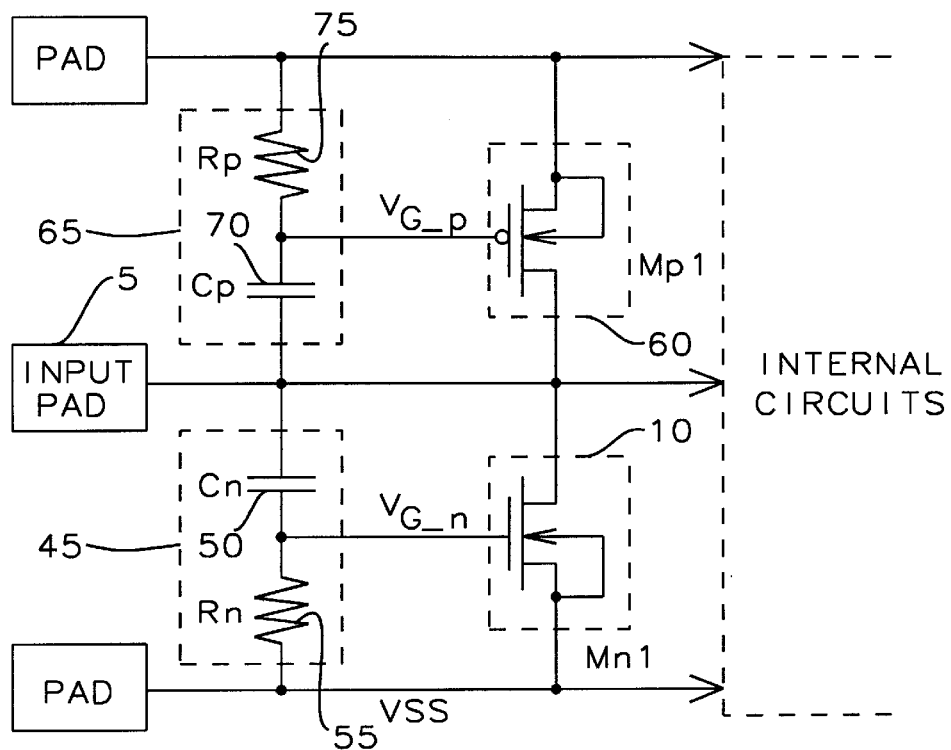
FIG. 5 – Prior Art
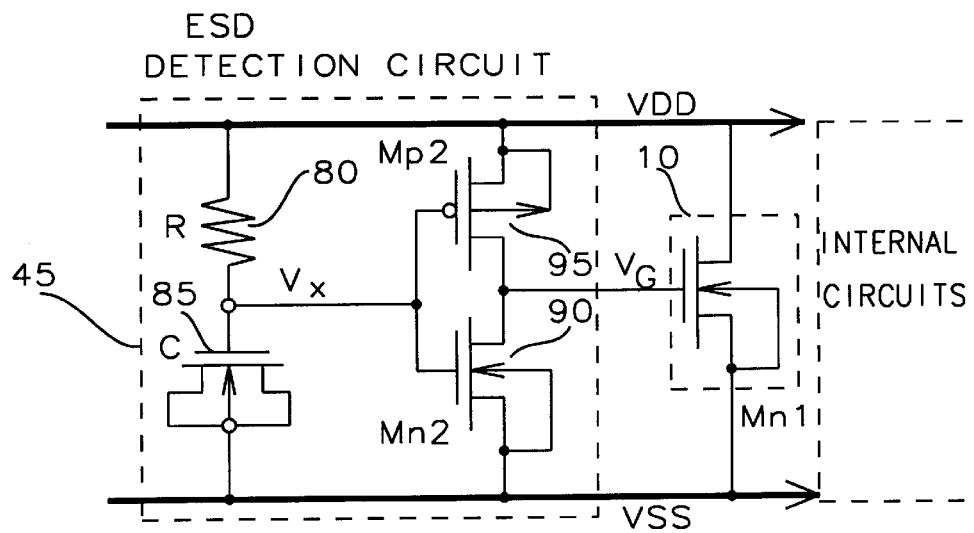
FIG. 6 – Prior Art

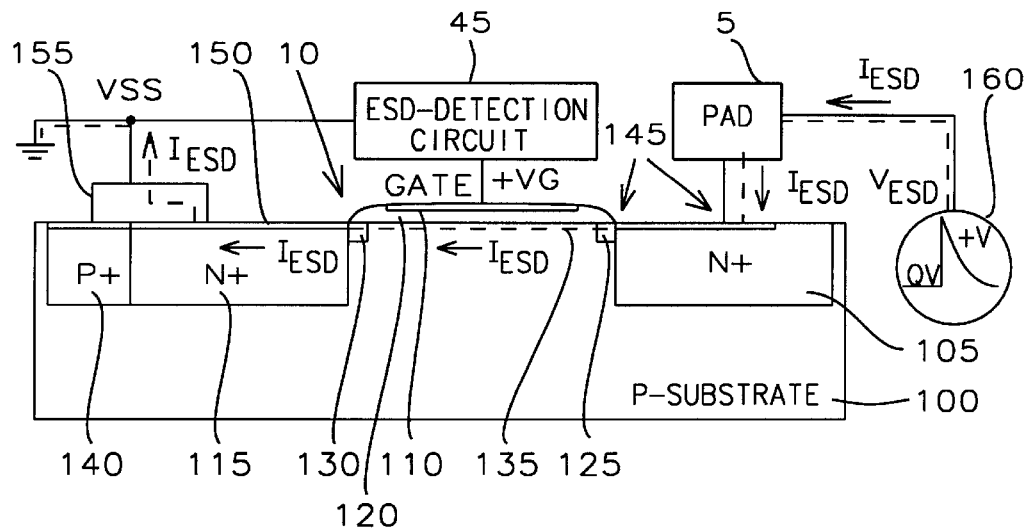
FIG. 7 - Prior Art
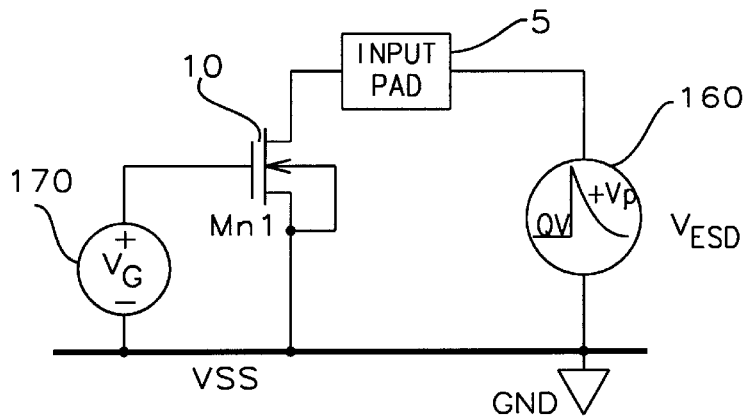
FIG. 8a - Prior Art
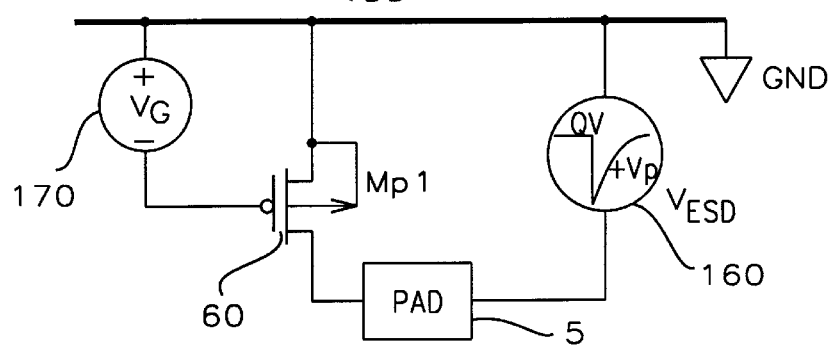
FIG. 8b - Prior Art

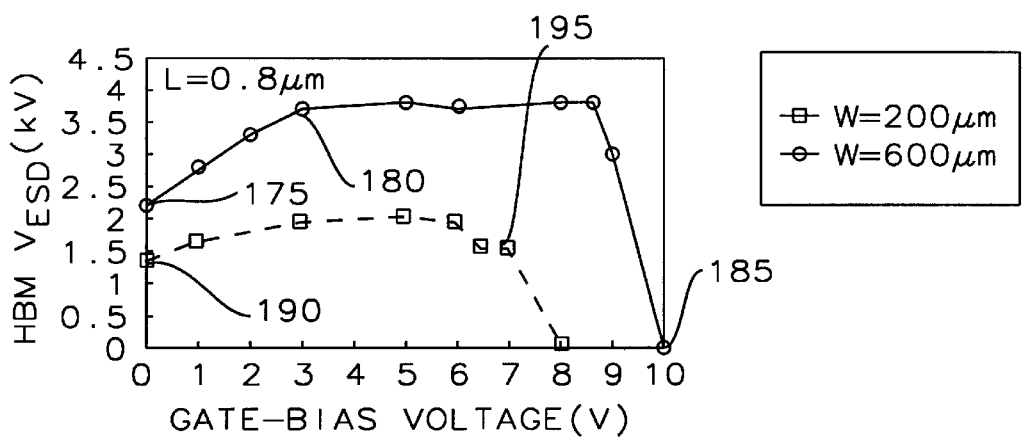
FIG. 9 - Prior Art
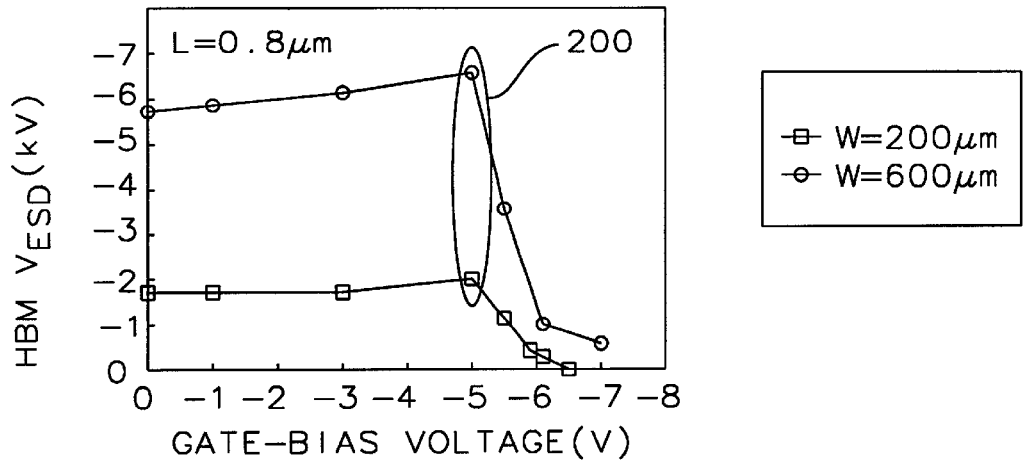
FIG. 10 - Prior Art
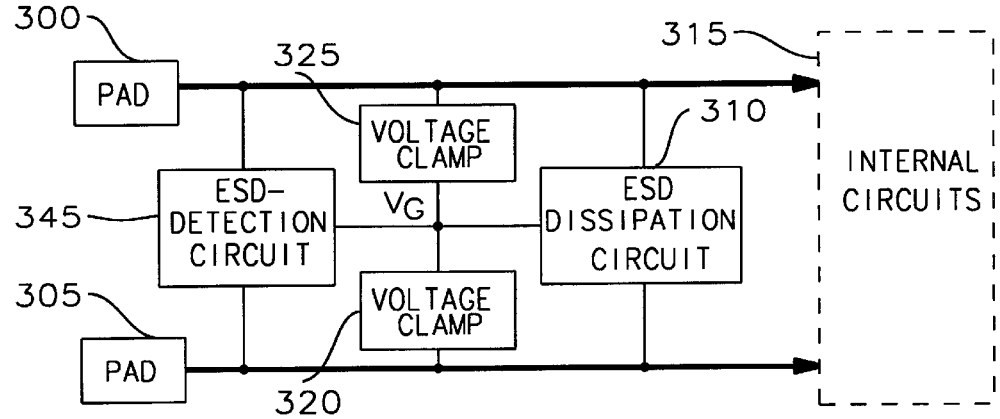
FIG. 11

ESD PROTECTION CIRCUIT WITHOUT OVERSTRESS GATE-DRIVEN EFFECT

BACKGROUND OF THE INVENTION

1. Field of the Invention

This invention is related to electrostatic discharge (ESD) protection circuits for integrated circuits formed on a semiconductor substrate. More particularly, this invention relates to ESD protection circuits that have gate driven charge dissipation transistors.

2. Description of the Related Art

Electrostatic discharge (ESD) damage has become one of the main reliability concerns on the integrated circuit (IC) products. Especially, now that complementary metal oxide semiconductor (CMOS) technology has been developed into the deep-submicron lithographic feature size, the scaled-down metal oxide semiconductor (MOS) devices and thinner gate oxide has become more vulnerable to the extreme voltage level from contact with an ESD source. For general industrial specification, the input and output pins of the IC products have to sustain the extreme voltage level from contact with an ESD source of above 2000V. Therefore, the ESD protection circuits have to be placed around the input and output pads of the IC's to protect the IC's against the ESD damage, by shunting the electrostatic charges present at the ESD source from the IC's.

A typical input ESD protection circuit is shown in FIG. 1. The input pad 5 is connected to the internal integrated circuits 15 and the ESD protection device 10. When an ESD source is brought in contact with the input pad 5 the ESD protection device 10 is forced into an avalanche breakdown causing the ESD protection device to conduct dramatically, thus dissipating the electrostatic charge from the ESD source.

The ESD protection device 10 is a gate grounded n-type MOS (GGnMOS) transistor Mn1 10 having its source, bulk, and gate connected to the substrate biasing voltage source VSS. The substrate biasing voltage source VSS may be an independent negative voltage source or the ground reference point. The drain of the GGnMOS transistor Mn1 10 is connected to input pad 5.

In order to sustain a high ESD current, the gate-grounded NMOS (often called GGnMOS) Mn1 10 in FIG. 1 is drawn with relatively a large device dimension, such as W/L=500 $\mu$m/0.5 $\mu$m in a typical 0.35 $\mu$m CMOS technology. With such a large device dimension, the GGnMOS transistor Mn1 10 is typically drawn with multiple fingered of polycrystalline silicon gates. The typical layout example of the GGnMOS transistor Mn1 10 for ESD protection as shown in FIG. 2 had been described in "Methodology For Layout Design And Optimization Of ESD Protection Transistors," S. G. Beebe, 1996 EOS/ESD Symp. Proc., pp.265–275.

The GGnMOS transistor Mn1 10 is connected to the input pad 5 with the metal lands 20. The metal lands 20 are connected to the N+ drain diffusion 25 of the GGnMOS transistor Mn1 10. The N+ source diffusions 30 are connected together and to the substrate biasing voltage source VSS. Multiple fingers 35 of heavily doped polycrystalline silicon form the gates of the GGnMOS transistor Mn1 10. The gates 35 of the GGnMOS transistor Mn1 10 are connected through the metal land 40 to the substrate biasing voltage source VSS.

It has been found that the GGnMOS transistor Mn1 10 having a relatively large device dimension can sustain only a relatively low ESD voltage level, because the multiple heavily doped polycrystalline silicon gates 35 cannot uniformly turn on the GGnMOS transistor Mn1 10 during the extreme voltage level from contact with an ESD source as described in "Improving The ESD Failure Threshold Of Silicided NMOS Output Transistors By Ensuring Uniform Current Flow," T. L. Polgreen et al., IEEE Trans. Electron Devices, vol. 39, pp. 379–388, 1992.

Since only some regions of the GGnMOS transistor Mn1 10 are turned on, the charge to be conducted from the ESD source causes the current density within the channel of those turned-on regions to be large. This causes damage to several of the fingers of the gates of the GGnMOS transistor Mn1 10. So, even though the GGnMOS transistor Mn1 10 has a relatively large device dimension, it is effectively a much smaller transistor that cannot sustain the large ESD current.

In order to improve the tolerance of the ESD protection device to the extreme voltage levels from the ESD source, the multiple heavily doped polycrystalline silicon gates 35 of the ESD protection NMOS transistor Mn1 10 have to be uniformly turned on to share the current from the ESD source. If all the heavily doped polycrystalline silicon gates 35 of the ESD protection NMOS transistor Mn1 10 can be uniformly turned on during the extreme voltage level from contact with an ESD source, the ESD protection NMOS transistor Mn1 10 can sustain high levels of voltage from the ESD source as described by T. L. Polgreen et al.

To achieve the uniform turn-on behavior among the multiple heavily doped polycrystalline silicon gates 35 of the MOS transistor Mn1, a gate-driven technique is described in U.S. Pat. No. 4,855,620 (C. Duvvury et al.); U.S. Pat. No. 5,086,365 (C. -D. Lien); "Dynamic Gate Coupling Of NMOS For Efficient Output ESD Protection," C. Duvvury et al., Proc. of IRPS, 1992, pp. 141–150; "Achieving Uniform NMOS Device Power Distribution For Submicron ESD Reliability," C. Duvvury et al., Tech. Dig IEDM, 1992, pp. 131–134; "EOS/ESD Reliability Of Deep Sub-Micron NMOS Protection Devices," S. Ramaswamy et al., Proc. of IRPS, 1995, pp. 284–291; "Capacitor-Couple ESD Protection Circuit For Deep-Submicron Low-Voltage CMOS ASIC," M. -D. Ker et al., IEEE Trans. on VLSI Systems, vol. 4, pp. 307–321, September, 1996; and U.S. Pat. No. 5,631,793 (M. -D. Ker et al.).

This improves the tolerance of the MOS transistor Mn1 to the extreme voltage levels from contact with the ESD source. The structure of a gate-driven input ESD protection circuit is shown in FIG. 3. An ESD-detection circuit is connected from the input pad 5 to the gate of the ESD protection NMOS transistor Mn1 10. When the pad 5 is exposed to the extreme voltage level of an ESD source, the ESD-detection circuit 45 will generate a voltage VG to bias the gate of the ESD protection NMOS transistor Mn1 10. Therefore, the voltage level at the multiple heavily doped polycrystalline silicon gates 35 of the ESD protection NMOS transistor Mn1 10 causes the ESD protection NMOS transistor Mn1 10 to be uniformly turned on to dissipate the charge from the ESD source and allow the integrated circuit to withstand a higher voltage level present at the ESD source. A typical gate-driven design for an input ESD protection circuit is shown in FIG. 4, where the ESD-detection circuit can be simply realized by a capacitor C 50 and a resistor R 55. The capacitor C 55 is connected from the input pad 5 to the gate of the ESD protection NMOS transistor Mn1 10 and the gate of the ESD protection NMOS transistor Mn1 10 is connected to the substrate biasing voltage source VSS through a resistor R 55. The capacitor C 40 is used to couple the ESD transient voltage level of the ESD voltage source from the pad 5 to the gate of the ESD protection NMOS transistor Mn1 10. With a coupled voltage VG on the gate of the ESD protection NMOS transistor Mn1 10, all the heavily doped polycrystalline silicon gates 35 of the ESD protection NMOS transistor Mn1 10 can be uniformly turned on to bypass the ESD current and dissipate the charge from the ESD source.

Therefore, the voltage level of the ESD source that the ESD protection NMOS transistor Mn1 10 can sustain before failure can be effectively improved. To maintain the coupled voltage VG on the gate of the ESD protection NMOS transistor Mn1 10, a resistor Rn 55 is added from the gate of the ESD protection NMOS transistor Mn1 10 to the substrate biasing voltage source VSS. When the ESD-transient voltage from the ESD voltage source connected to the input pad 5 is coupled through the capacitor C 50 to the gate of the ESD protection NMOS transistor Mn1 10, such coupled voltage VG is held longer in time as a result of the time constant of the resistor R 55 and the capacitor C 50. So, the ESD protection NMOS transistor Mn1 10 can be efficiently turned on to bypass the ESD current and dissipate the electrostatic charge from the ESD source. Such a gate-coupled NMOS (GCnMOS) transistor is described in "Dynamic Gate Coupling Of NMOS For Efficient Output ESD Protection," C. Duvvury et al., Proc. of IRPS, 1992, pp. 141–150; "Achieving Uniform NMOS Device Power Distribution For Submicron ESD Reliability," C. Duvvury et al., in Tech. Dig IEDM, 1992, pp. 131–134; "EOS/ESD Reliability Of Deep Sub-Micron NMOS Protection Devices," S Ramaswamy et al., in Proc. of IRPS, 1995, pp. 284–291.

An alternative embodiment of the gate-driven ESD protection circuit as shown in FIG. 5 is described in "Capacitor-couple ESD protection circuit for deep-submicron low-voltage CMOS ASIC," M. -D. Ker et al., IEEE Trans. on VLSI Systems, vol.4, pp. 307–321, September, 1996; U.S. Pat. No. 5,631,793 (M. -D. Ker et al.). In this alternate embodiment the gate-driven technique is applied to both the ESD protection NMOS transistor Mn1 10 and the PMOS transistor Mp1 60 in the input ESD protection circuit to achieve the uniform turn-on and therefore uniform current density in the ESD protection NMOS transistor Mn1 10 and the PMOS transistor Mp1 60.

The first ESD protection NMOS transistor Mn1 10 and the first charge detection circuit 45 are structured and perform as described in FIG. 4. The second charge detection circuit 65 is constructed of the capacitor Cp 70 and the resistor Rp 75. The capacitor Cp 70 is connected between the input pad 5 and the gate of the ESD protection PMOS transistor Mp1 60. The resistor Rp 75 is connected between the gate of the ESD protection PMOS transistor Mp1 60 and the power supply voltage source VDD. The drain of the ESD protection PMOS transistor Mp1 60 is connected to the power supply voltage source VDD. The source of the ESD protection PMOS transistor Mp1 60 is connected to the input pad 5.

To further protect the internal circuits of an IC, an ESD protection circuit must be placed between the power supply voltage source VDD and the substrate biasing voltage source VSS power distribution terminals of the IC as discussed in "Whole-Chip ESD Protection Design With Efficient VDD-To-VSS ESD Clamp Circuit For Submicron CMOS VLSI," M. -D. Ker, IEEE Trans. on Electron Devices, vol. 46, no. 1, pp. 173–178, January, 1999 (M. -D. Ker ED 46).

Some effective ESD protection circuits for placing between the power supply voltage source VDD and substrate biasing voltage source VSS power distribution terminals have been described in M. -D. Ker ED 46; "ESD Design Methodology," R. Merrill et al., EOS/ESD Symp. Proc., 1993, EOS-15, pp. 233–237; "Core Clamps For Low Voltage Technologies," S. Dabral et al., EOS/ESD Symp. Proc., 1994, EOS-16, pp. 141–149; "Sub-Micron Chip ESD Protection Schemes Which Avoid Avalanching Junctions," B. R. Worley et al., EOS/ESD Symp. Proc., 1995, EOS-17, pp. 13–20; U.S. Pat. No. 5,237,395 (K. F. Lee); U.S. Pat. No. 5,255,146 (W. Miller); U.S. Pat. No. 5,287,241 (D. S. Puar); U.S. Pat. No. 5,311,391 (T. Dungan et al.); U.S. Pat. No. 5,440,162 (B. R. Worley et al.); U.S. Pat. No. 5,610,791 (S. Voldman); and U.S. Pat. No. 5,625,280 (S. Voldman).

In such power supply voltage source to substrate biasing voltage source VDD-to-VSS ESD protection circuits, the gate-driven technique is also applied to turn on the ESD protection NMOS transistor. Another embodiment of a power supply voltage source to substrate biasing voltage source VDD-to-VSS ESD protection circuit using the gate-driven technique is illustrated in FIG. 6.

In this embodiment, the ESD protection NMOS transistor Mn1 10 has its drain connected to the power supply voltage source VDD and its source connected to the substrate biasing voltage source VSS. The ESD detection circuit 45 has its input ports connected to the power supply voltage source VDD and the substrate biasing voltage source VSS. The ESD detection circuit 45 is formed of the resistor R 85, the capacitor C 80, the NMOS buffer transistor Mn2 90, and the PMOS buffer transistor Mp2 95. The resistor R 80 is connected between the input port connected to the power supply voltage source VDD and the common connection of the gates of the NMOS buffer transistor Mn2 90, and the PMOS buffer transistor Mp2 95. The capacitor C 80 in this embodiment is formed of an NMOS transistor having its gate connected to the commonly connected gates of the NMOS buffer transistor Mn2 90, and the PMOS buffer transistor Mp2 95. The drain, source, and bulk of the NMOS transistor that forms the capacitor C 80 are commonly connected to the input port of the ESD detection circuit connected to the substrate biasing voltage source VSS.

In this embodiment of the ESD-detection circuit, the resistor R 80 and the capacitor C 85 have an RC time constant from approximately 0.1 $\mu$sec to approximately 1.0 $\mu$sec to detect the ESD transition across the power supply voltage source VDD and substrate biasing voltage source VSS. The ESD protection NMOS transistor Mn1 10 can be quickly turned on to clamp the ESD overstress voltage across the power supply voltage source VDD and substrate biasing voltage source VSS lines. This embodiment is a typical application of gate-driven technique in the ESD protection circuit. But, when the CMOS transistor dimensions enter into the deep-submicron lithographic feature size, the shallower junction depth, the LDD (lightly-doped drain) structure, and the silicided diffusion cause a lower ESD level to be sustained by the ESD protection NMOS transistor Mn1 10. These effects are explained in "Scaling, Optimization And Design Consideration Of Electrostatic Discharge Protection Circuits In CMOS Technology," S. Voldman et al., EOS/ESD Symp. Proc., pp. 251–260, 1993; "The Impact Of Technology Scaling On ESD Robustness And Protection Circuit Design," A. Amerasekera et al., EOS/ESD Symp. Proc., pp. 237–245, 1994; and "Process And Design Optimization For Advanced CMOS I/O ESD Protection Devices," S. Daniel et al., EOS/ESD Symp. Proc., pp. 206–213, 1990.

The ESD protection NMOS transistor Mn1 10 between the power supply voltage source VDD and substrate biasing voltage source VSS terminals are therefore designed with a huge device dimension to sustain a desired ESD voltage level. This transistor then consumes a large silicon area on a silicon substrate when the IC's are formed.

It is shown that the gate voltage VG on the ESD protection NMOS transistor Mn1 10 can be sufficiently large to cause damage at a much lower ESD voltage level than its original ESD voltage level without gate bias. This phenomenon is discussed in "Substrate Triggering And Salicide Effects On ESD Performance And Protection Circuit Design In Deep Submicron CMOS Process," A. Amerasekera, et al., IEDM Tech. Dig., 1995, pp. 547–550; "Design Methodology For Optimized Gate Driven ESD Protection Circuits In Submicron CMOS Processes," J. Chen, et al., Proc. of EOS/ESD Symp., pp. 230–239, 1997; "Design Methodology And Optimization Of Gate-Driven NMOS ESD Protection Circuits In Submicron CMOS Processes," J. Chen, et al., IEEE Trans, on Electron Devices, vol. 45, no. 12, pp. 2448–2456, December, 1998; and "ESD Protection For Mixed-Voltage I/O Using NMOS Transistors Stacked In A Cascade Configuration," W. Anderson et al., Proc. of EOS/ESD Symp., pp. 54–62, 1998, and is illustrated in FIG. 7.

The ESD protection NMOS transistor Mn1 10 is formed in the semiconductor substrate 100. The drain 105 of the ESD protection NMOS transistor Mn1 10 is created by diffusing an N+ material into the surface of the semiconductor substrate 100. Likewise, the source 115 is created by diffusing the N+material into the surface of the semiconductor substrate 100. A lightly doped N material is diffused into the surface of the semiconductor substrate 100 to form the lightly doped drain areas 125 and 130 respectively adjacent to the drain 105 and the source 115. In the region between drain 105 and the source 115, and insulating material is formed to form the gate oxide 120. On the gate oxide, a conductive material such as heavily doped polycrystalline silicon is formed to create the gate 110. A heavily doped P-type material is diffused into the surface of the semiconductor substrate 100 to form the contact point 140 to the semiconductor substrate 100. A metal such as Titanium (Ti) or Tungsten (W) are alloyed with the silicon of the semiconductor substrate to form the silicide areas 145 and 150. The suicide areas 145 and 150 insure a low resistivity contact from the drain 105, the source 115 and the substrate contact 140 to external circuitry.

The pad 5 is connected to the drain 105 and one of the input ports of the ESD detection circuit 45. The source 115 and the substrate contact 140 are connected through the metal land 155 to the substrate biasing voltage source VSS. As described above, the second input port of the ESD detection circuit 45 is connected to the substrate biasing voltage source VSS. The output port of the ESD detection circuit 45 is connected to the gate 110.

While the ESD source 160 is connected to the PAD 5, the ESD-detection circuit 45 will detect the ESD voltage level VESD and generate a voltage VG to bias the gate of the ESD protection NMOS transistor Mn1 10. Therefore, the ESD protection NMOS transistor Mn1 10 is quickly turned on to bypass the overstress ESD current IESD. However, in the deep-submicron CMOS process, if the voltage level VG at the gate 110 of the ESD protection NMOS transistor Mn1 10 is at a high voltage level during the extreme voltage level from contact with an ESD source, a surface channel 135 of the ESD protection NMOS transistor Mn1 10 is formed, and the ESD current IESD is discharged through the much shallower surface channel 135 of the ESD protection NMOS transistor Mn1 10. The ESD current IESD is often on the order of several amperes (A). For example, a 2 -KV human-body-model (HBM) ESD event can generate an ESD current IESD of about 1.33 A. Such a large ESD current flowing through the shallower surface channel 135 forces a very high current density and can easily destroy the ESD protection NMOS transistor Mn1 10 even if the ESD protection NMOS transistor Mn1 10 has a relatively huge device dimension. Thus, this phenomenon generally causes a much lower voltage level to be sustained by the ESD protection NMOS transistor Mn1 10. This phenomenon has been referred to as the "overstress gate-driven effect".

To practically demonstrate the gate-driven effect on the ESD protection NMOS transistor Mn1 10 and ESD protection PMOS transistor Mp1 60 in the deep-submicron CMOS process, an experimental measurement setup is shown in FIGS. 8a and 8b. In FIG. 8a, a ESD protection NMOS transistor Mn1 10 is fabricated by using a 0.35 µm, CMOS process.

A gate biasing voltage source 170 is connected between the gate of the ESD protection NMOS transistor Mn1 10 and the substrate biasing voltage source VSS. The substrate biasing voltage source VSS is then connected to the ground reference point. The drain of the ESD protection NMOS transistor Mn1 10 is connected to the pad 5. A test ESD voltage source 160 is connected between the pad 5 and the ground reference point and provides an ESD voltage $V_{ESD}$ having a positive polarity.

In FIG. 8b, the gate biasing voltage source is connected between the gate of the ESD protection PMOS transistor Mp1 60 and the power supply voltage source VDD. For this test structure, the terminal of the integrated circuit that is normally connected to the power supply voltage source VDD is now connected to the ground reference point. The source of the ESD protection PMOS transistor Mp1 60 is connected to the terminal of the integrated circuit normally connected to the power supply voltage source VDD. The drain of the ESD protection PMOS transistor Mp1 60 is connected to the pad 5. The test ESD voltage source 160 is again connected between the input pad 5 and the ground reference point. The test ESD voltage source 160, in this test, provides an ESD voltage with a negative polarity.

The ESD-sustained level of the test of the gate-driven ESD protection NMOS transistor Mn1 10 is summarized and shown in FIG. 9. The ESD protection NMOS transistor Mn1 10 in the ESD test have a channel length of 0.8 µm. The ESD protection NMOS transistor Mn1 10 with a channel width of 600 µm has a human-body-model (HBM) ESD voltage level sustainable of only about 2.2 kV while the voltage level of the gate biasing voltage source VG 170 is 0V 175. But, the HBM ESD voltage level sustainable by the ESD protection NMOS transistor Mn1 10 can be increased to 4 kV when the voltage level of the gate biasing voltage source VG 170 is increased to 3V. The improvement on the ESD voltage level sustainable by the ESD protection NMOS transistor Mn1 10 with a positive voltage level of gate biasing voltage source VG 170 is due to the uniform turn-on along the multiple heavily doped polycrystalline silicon gates 35 of the ESD protection NMOS transistor Mn1 10 during the application of the extreme voltage level from contact with an ESD source. But, when the voltage level of the gate biasing voltage source VG 170 is greater than 9V, the ESD voltage level sustainable by the ESD protection NMOS transistor Mn1 10 is sharply dropped to a much lower level of around 100V 185. When the ESD protection NMOS transistor Mn1 10 has a device channel width of 200 µm, its ESD voltage level is increased as the voltage level of the gate biasing voltage source VG 170 is increased 190. But, when the voltage level of the gate biasing voltage source VG 170 is greater than 6V, its ESD voltage level sustainable by the ESD protection NMOS transistor Mn1 10 with 200 µm channel width is dropped down to a much lower voltage level 195. From the experimental results in FIG. 9, it is shown that a ESD protection NMOS transistor Mn1 10 with an over-biased gate voltage causes a much lower ESD voltage level than its original ESD voltage level without the voltage level of the gate biasing voltage source VG 170 voltage. This overstress gate-driven effect causes a much lower ESD voltage level sustainable by the ESD protection NMOS transistor Mn1 10 in deep-submicron CMOS process as reported in "Substrate Triggering And Salicide Effects On ESD Performance And Protection Circuit Design In Deep Submicron CMOS Process," A. Amerasekera, et al., IEDM Tech. Dig., 1995, pp. 547–550; "Design Methodology For Optimized Gate Driven ESD Protection Circuits In Submicron CMOS Processes," J. Chen, et al., Proc. of EOS/ESD Symp., pp. 230–239, 1997; "Design Methodology And Optimization Of Gate-Driven NMOS ESD Protection Circuits In Submicron CMOS Processes," J. Chen, et al., IEEE Trans, on Electron Devices, vol. 45, no. 12, pp. 2448–2456, December, 1998; and "ESD Protection For Mixed-Voltage I/O Using NMOS Transistors Stacked In A Cascade Configuration," W. Anderson et al., Proc. of EOS/ESD Symp., pp. 54–62,1998.

The results of the experiments to demonstrate the gate-driven effect on the ESD protection PMOS transistor Mp1 60 as described in FIG. 8b are summarized in FIG. 10. In FIG. 10, the negative HBM ESD voltage level sustainable by the ESD protection PMOS transistor Mp1 60 in a 0.35 µm CMOS process is slightly increased when the negative voltage level of the gate biasing voltage source VG 170 is increased. But, when the negative voltage level of the gate biasing voltage source VG 170 is lower than −5V, its ESD voltage level sustainable by the ESD protection PMOS transistor Mp1 60 sharply decreases to a much lower level 200. This experimental result verifies that the overstress gate-driven effect also has a negative impact on the ESD voltage level sustainable by the ESD protection PMOS transistor Mp1 60 in the deep-submicron CMOS process.

In summary, the gate-driven technique, which was previously reported to improve the ESD voltage level sustainable by the ESD protection MOS transistor can cause the unexpected serious degradation on the ESD voltage level sustainable by the ESD protection MOS transistor if its gate is over-biased with an extremely high voltage. However, as shown in the prior art, the ESD protection circuits having the gate-driven technique do not limit the gate voltage level of the charged dissipating MOS transistor.

SUMMARY OF THE INVENTION

An object of this invention is to provide an ESD protection circuit connected between two terminals of an integrated circuit to dissipate an electrostatic charge from an ESD source placed in contact with two terminals to prevent damage to the integrated circuits.

Another object of this invention is to provide an ESD protection circuit that is connected between an input pad, a first power supply terminal, and a second power supply terminal of an integrated circuit to dissipate an electrostatic charge from an ESD source placed in contact with the input pad to prevent damage to the integrated circuit.

Further, another object of this invention is to provide an ESD protection circuit having a gate-driven charge dissipating device that will not have an excess voltage present at the driven gate.

Still further, another object of this invention is to provide an output driver circuit incorporating an ESD protection means that dissipates electrostatic charge from an ESD source.

Even further, another object of this invention is an ESD protection circuit connected between a first power supply terminal and a second power supply terminal of an integrated circuit to dissipate electrostatic charge from an ESD source that becomes in contact with either the first or second power supply terminals to prevent damage to the integrated circuit.

To accomplish these and other object, a first embodiment of the ESD protection circuit is connected between the first terminal and the second terminal of an integrated circuit for dissipating an electrostatic charge from an ESD source connected from the first terminal to the second terminal to protect the integrated circuit from damage caused by exposure to extreme voltage from the ESD source. The ESD protection circuit has an ESD shunting circuit to bypass the electrostatic charge from the integrated circuit. The ESD shunting circuit has a first port connected to the first terminal, a second port connected to the second terminal, and a third port. The ESD protection circuit additionally has an ESD detection circuit. The ESD detection circuit has a first input port connected to the first terminal, a second input port connected to the second terminal, and an output port connected to the third port of the ESD shunting circuit. When the ESD detection circuit detects the presence of the electrostatic charge from the ESD source, the ESD detection circuit generates an excess voltage at the third port that will damage the ESD shunting circuit. Finally, the ESD protection circuit has a voltage clamping circuit connected between the third port of the ESD shunting circuit and the second terminal to prevent the generation of the excess voltage at the third port of the ESD shunting circuit.

The ESD shunting circuit can be implemented as a MOS transistor having a source connected to the first terminal, a drain connected to the second terminal of the integrated circuit, and a gate connected to the third port of the ESD detection circuit.

The ESD protection circuit can be configured such that the first terminal is a voltage terminal of a power supply voltage source and the second terminal is an input signal terminal of the integrated circuit. Alternatively, the ESD protection circuit can be configured such that the first terminal is a reference terminal of a power supply voltage source and the second terminal is an input signal terminal of the integrated circuit. Additionally, the ESD protection circuit can be configured such that the first terminal is a voltage terminal of a power supply voltage source and the second terminal is reference terminal of the power supply voltage source.

The ESD detection circuit is composed of a capacitor connected between the first input port and the output port of the ESD detection circuit and an optional resistor connected between the output port and the second input port of the ESD detection circuit. The function of the optional resistor can be performed by the voltage clamping circuit and therefore can be eliminated if desired.

The voltage clamping circuit is formed from a plurality of diodes, which are serially connected cathode to anode between the output port of the ESD detection circuit and the second terminal. The diodes can be created by configuring MOS transistors with commonly connected gates and drains to force the MOS transistors into diode operation. Alternately, the voltage clamping circuit is a zener diode having a cathode connected to the output port of the ESD detection circuit and an anode connected to the second terminal.

A second embodiment of the ESD protection circuit is connected between a first power supply terminal, a second power supply terminal, and an input/output signal terminal of an integrated circuit formed on a semiconductor substrate. The ESD protection circuit dissipates an electrostatic charge from an ESD source connected to the input/output signal terminal to protect the integrated circuit from damage caused by exposure to extreme voltage from the ESD source. The ESD protection circuit has a first ESD shunting circuit for shunting the electrostatic charge having a first charge polarity from the integrated circuit. The first ESD shunting circuit has a first port connected to the first power supply terminal, a second port connected to the input/output signal terminal, and a third port. The ESD protection circuit also has a second ESD shunting circuit for shunting the electrostatic charge of a second charge polarity from the integrated circuit. The second charge polarity being opposite that of the first charge polarity. The second ESD shunting circuit has a first port connected to the second power supply terminal, a second port connected to the input/output signal terminal, and a third port. A first ESD detection circuit has a first input port connected to the first power supply terminal, a second input port connected to the input/output signal terminal, and a first output port connected to the third port of the first ESD dissipating circuit. The ESD detection circuit, when detecting the electrostatic charge of the first polarity, will generate a first excess voltage that will damage the first ESD shunting circuit. Additionally, a second ESD detection circuit has a first input port connected to the second power supply terminal, a second input port connected to the input/output signal terminal, and an output terminal connected to the third port of the second ESD dissipation circuit. In addition, when detecting the electrostatic charge of the second polarity, the second ESD detection circuit will generate a second excess voltage that will damage the second ESD detection circuit. The ESD protection circuit has a first and second voltage clamping circuits. The first voltage clamping circuit is connected between the third port of the first ESD shunting circuit and the first power supply terminal to prevent generation of the first excess voltage at the third port of the first ESD shunting circuit. The second voltage clamping circuit is connected between the third port of the second ESD shunting circuit and the second power supply terminal to prevent generation of the second excess voltage at the third port of the second ESD shunting circuit.

A third embodiment of the this invention describes an integrated circuit output driver circuit for transferring digital signals from internal circuits to an output pad connected to a transmission medium and for dissipating electrostatic charge from an ESD source connected to the output pad. The output driver circuit has a driver circuit which is connected between a first power supply terminal and a second power supply terminal, and to the output pad to provide current to and to accept current from the transmission medium and to dissipate the electrostatic charge when the ESD source is connected to the output pad. The output driver circuit has a first and second signal input terminal that is connected the internal circuits to the driver circuit to receive the digital signals from the internal circuits. The output driver circuit further has a first and second ESD detection circuits. The first ESD detection circuit is connected between the output pad and the first signal input terminal to detect the electrostatic charge of a first plurality and to provide a first signal to activate the driver circuit to dissipate the electrostatic charge. When detecting the electrostatic charge, the first ESD detection circuit generates a first excess voltage at the first signal input terminal that will damage the driver circuit. The second ESD detection circuit is connected between the output pad and the second signal input terminal to detect the electrostatic charge when it is of a second polarity, which is of a polarity opposite that of the first polarity. The second ESD detection circuit then activates the driver circuit to dissipate the electrostatic charge. When detecting the electrostatic charge of the second polarity, the second ESD detection circuit generates a second excess voltage that will damage the driver circuit. The output driver circuit has a first and second voltage clamping circuits. The first voltage clamping circuit is connected between the first signal input terminal and the first power supply terminal to prevent the generating of the first excess voltage. The second voltage clamping circuit connected between the second signal input terminal and the second power supply terminal to prevent the generating of the second excess voltage.

A fourth embodiment of this invention is an ESD protection circuit connected between a first power supply terminal and a second power supply terminal of an integrated circuit formed on a semiconductor substrate for dissipating an electrostatic charge from an ESD source in contact with the first and second power supply terminals to protect the integrated circuits from damage caused by exposure to extreme voltage from the ESD source. The ESD protection circuit is has a ESD shunting circuit for shunting the electrostatic charge from the integrated circuit. The ESD shunting circuit has a first port connected to the first power supply terminal, a second port connected to the second power supply terminal, and a third port. The ESD protection circuit has an ESD detection circuit having a first input port connected to the first power supply terminal, a second input port connected to the second power supply terminal, and an output port connected to the third port of the ESD shunting circuit. The ESD detection circuit, when detecting the electrostatic charge, generates an excess voltage at the third port of the ESD shunting circuit, thus causing damage to the ESD shunting circuit. The ESD protection circuit has a voltage clamping circuit that is connected between the output port of the ESD detection circuit and the second power supply terminal to prevent the generation of the excess voltage at the third port of the ESD shunting circuit.

BRIEF DESCRIPTION OF THE DRAWINGS

FIGS. 3 and 4 are schematic drawings of a gate-driven ESD protection circuit of the prior art.

FIG. 5 is a schematic drawing of a gate-driven ESD protection circuit to dissipate electrostatic charge from ESD sources having opposite polarity of the prior art.

FIG. 6 is a schematic drawing of a gate-driven ESD protection circuit of the prior art connected between two power supply terminals of an integrated circuit.

FIG. 7 is a cross-sectional diagram of a gate-driven ESD protection NMOS transistor of the prior art.

FIGS. 8a and 8b are schematic diagrams of a test circuit used to validate the gate over-stress effect of the gate-driven charge dissipating MOS transistor.

FIGS. 9 and 10 are plots of the sustainable voltage level of the ESD source at which the gate-driven ESD protection NMOS transistor of the prior art breaks down as a function of the voltage level present at the gate of the charge dissipating MOS transistor.

FIG. 11 is a block diagram of a first embodiment of an ESD protection circuit of this invention.

DETAILED DESCRIPTION OF THE INVENTION

Figure 1:
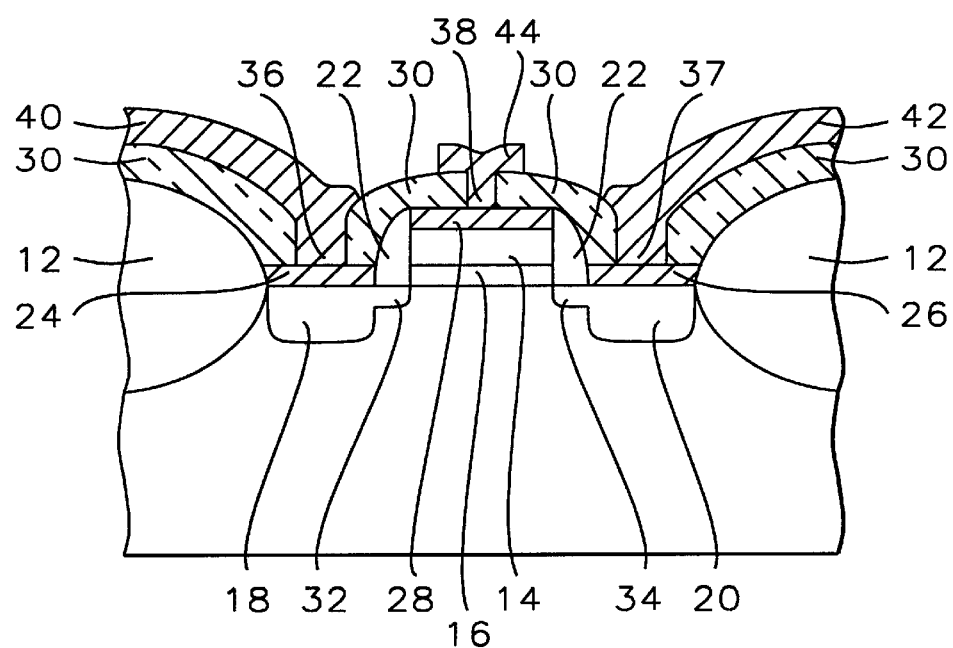
FIG. 1 is a schematic drawing of an ESD protection circuit employing a gate-grounded NMOS FET of the prior art.
Figure 2:
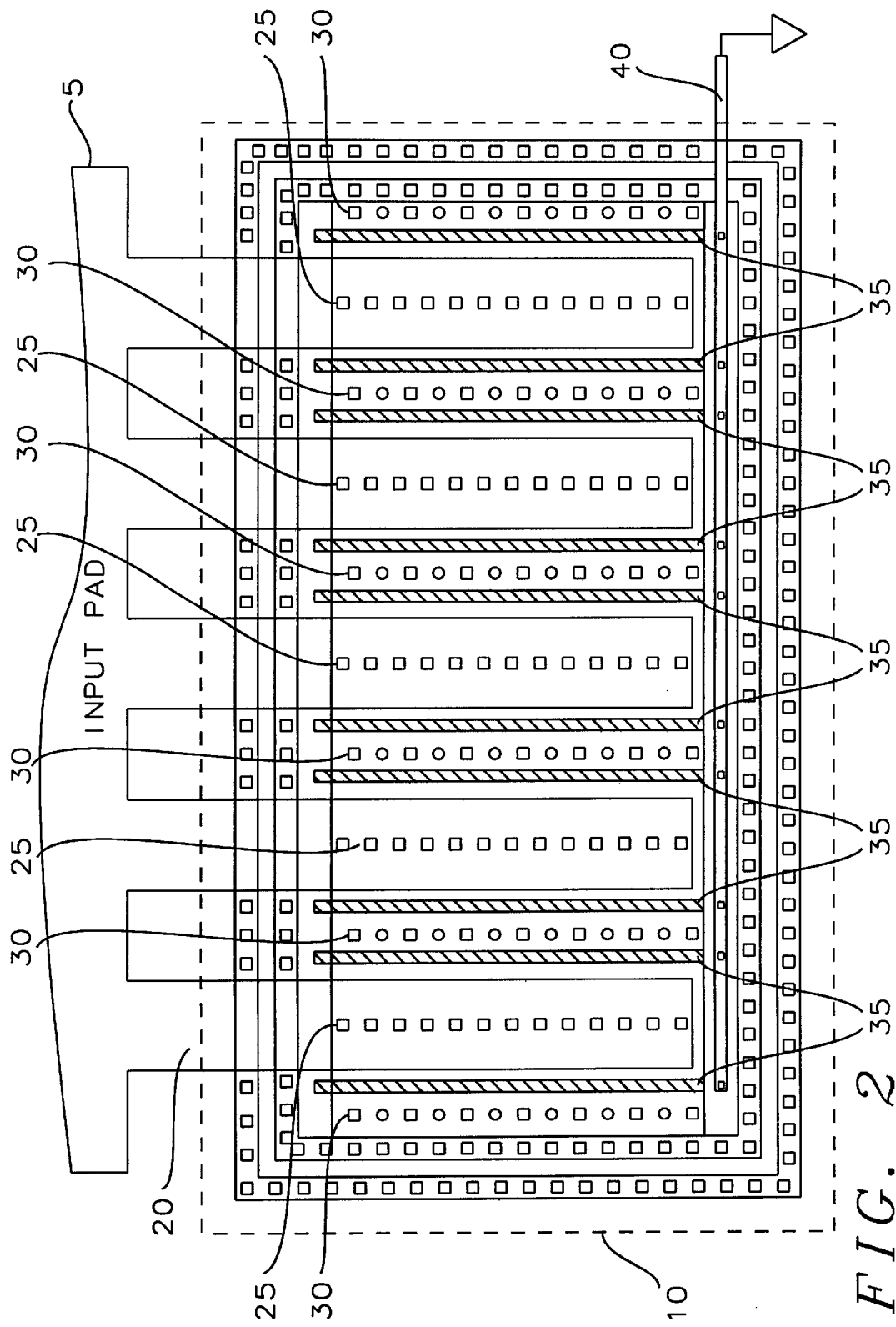
FIG. 2 is a planar view of a gate-grounded NMOS FET of the prior art.

Refer now to FIG. 11 for a discussion of a first embodiment of an ESD protection circuit with no voltage overstress of the input to a charge dissipating device of this invention. The ESD protection circuit of this invention is connected between the terminals 300 and 305 of the internal circuits 315 of the integrated circuits that are formed on a semiconductor substrate. An ESD source of a first polarity can be brought in contact with the first terminal 300. Alternately, an ESD source of a polarity opposite that of the first polarity can be brought in contact with the second terminal 305.

The ESD dissipation circuit 310 has a first output port connected to the first terminal 300 and a second output port connected to the second terminal 305. If the input port has a signal indicating that an ESD source is connected to either the first or second terminals 300 and 305, the ESD dissipation circuit 310 is engaged to conduct the ESD current and dissipate any charge present on the ESD source.

The ESD detection circuit 345 has two input ports connected between the two terminals 300 and 305 to detect the presence of the ESD source in contact with either of the two terminals 300 and 305. When the ESD source is present at one of the two terminals 300 and 305, the output port VG of the ESD detection circuit has an activate signal to engage the ESD dissipation circuit 310. Because of the extreme voltage levels present at the ESD source, the output port VG of the ESD detection circuit 345 has an excess voltage level. This excess voltage level is sufficient to cause damage to the ESD dissipation circuit 310 as described above.

To prevent the excess voltage from forming, one of the voltage clamping circuits 320 and 325 is activated to fix the voltage level of the output port of the ESD detection circuit 345 at a level sufficient to activate the ESD dissipation circuit 310 but not cause damage to the ESD dissipation circuit 310.

The voltage clamping circuit 320 is activated when the ESD source has the first polarity, while the voltage clamping circuit 325 is activated when the ESD source has the polarity opposite that of the first polarity.

Figure 12:
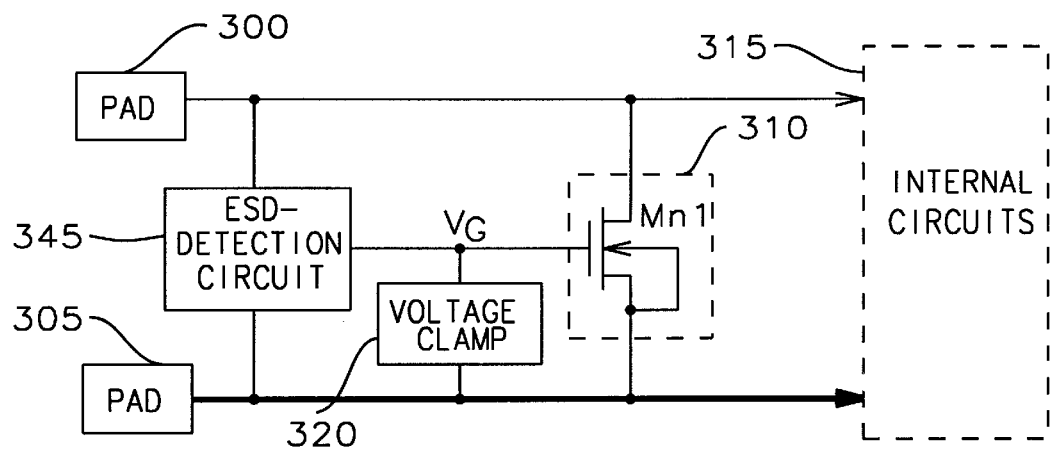
FIGS. 12–21 are schematic drawings of various implementations of a first embodiment of the ESD protection circuit of this invention.

Refer to FIGS. 12–17 for a discussion of various implementations of the first embodiment of the ESD protection circuit of this invention. In FIG. 12, the first terminal 300 is an input signal terminal to receive signals from external circuits. The second terminal 305 is the power supply terminal connected to the substrate biasing voltage source VSS.

The charge dissipation circuit 310 is implemented as the NMOS transistor Mn1. The charge dissipating NMOS transistor Mn1 310 has its drain connected to the input signal terminal 300 and its source connected to the power supply terminal 305 connected to the substrate biasing voltage source VSS. The gate of the charge dissipating NMOS transistor Mn1 310 is connected to the output port VG of the ESD detection circuit 345.

The voltage clamping circuit 320 is connected as described above between the output port VG of the ESD detection circuit 345 and the power supply terminal 305.

The charge dissipation circuit 310 of this implementation is an NMOS transistor having relatively large dimensions to minimize current density during the charge dissipation. The polarity of the voltage of the ESD source applied to the input signal terminal 300 is to be positive or alternately the polarity of the ESD source applied to the power supply terminal 305 is negative for the charge dissipation circuit 310 to operate properly.

Figure 13:
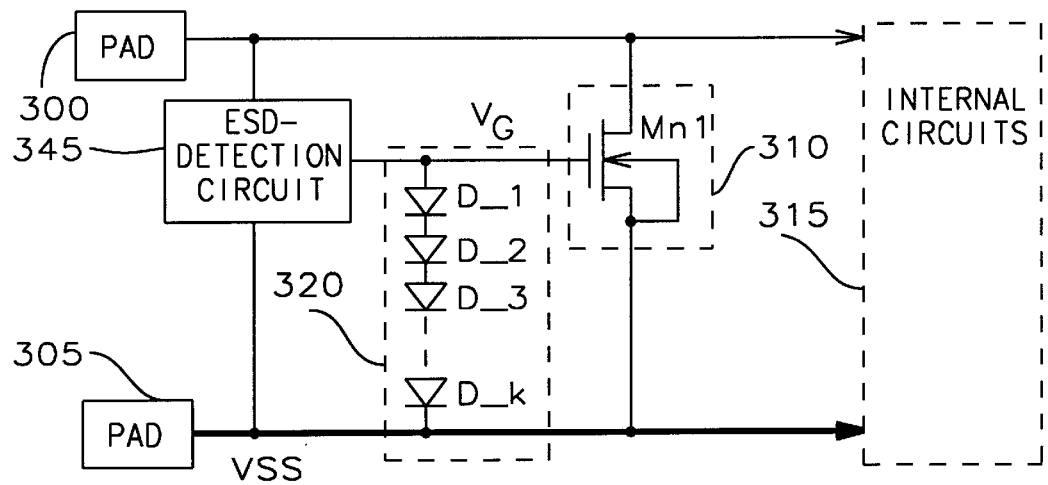
Figure 14:
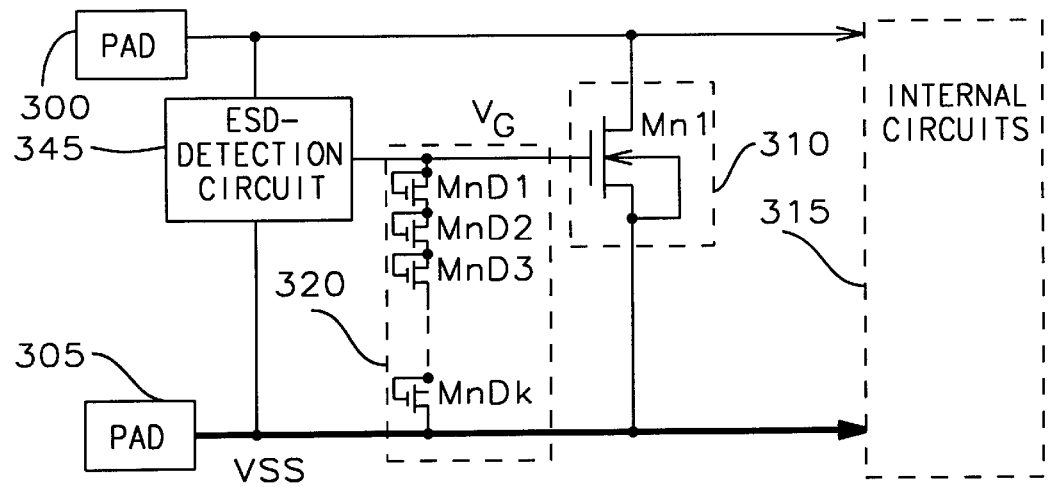
Figure 15:
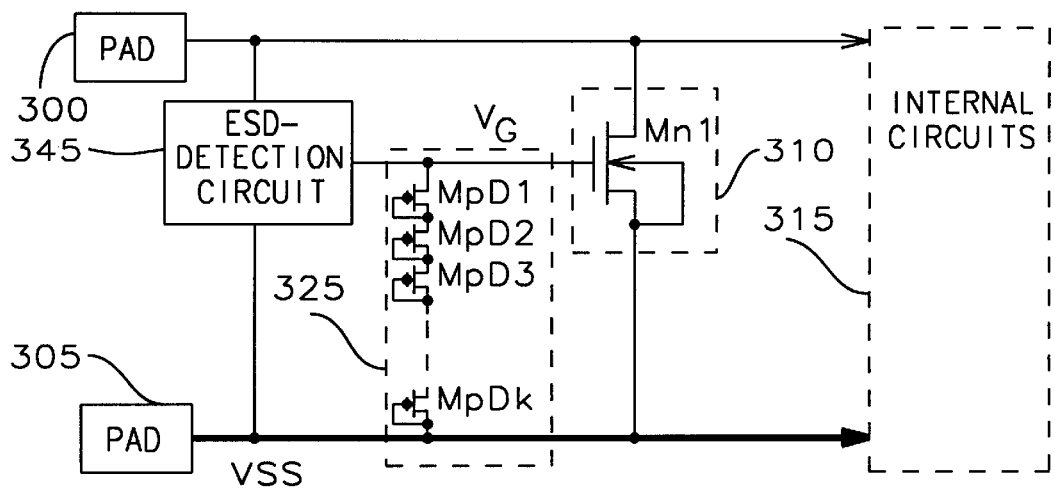

FIG. 13 illustrates an implementation of the voltage clamping circuit 320. The voltage clamping circuit is a plurality of diodes D_1, D_2, D_3, ..., D_k that are serially connected cathode to anode between the output port VG of the ESD detection circuit and the power supply terminal 305 connected to the substrate biasing voltage source VSS. The diodes of the voltage clamping circuit 320, as shown in FIG. 14, can be formed of the diode connected NMOS transistors MnD1, MnD2, MnD3, ..., MnDk. The NMOS transistors MnD1, MnD2, MnD3, ..., MnDk each have their gates and drains commonly connected to force the NMOS transistors MnD1, MnD2, MnD3, ..., MnDk into diode operation. The diodes of the voltage clamping circuit 320, alternately, may be implemented as PMOS transistors as shown in FIG. 15. The PMOS transistors MpD1, MpD2, MpD3, ..., MpDk have their gates and drains commonly connected to force the PMOS transistors MpD1, MpD2, MpD3, ..., MpDk into diode operation.

Figure 16:
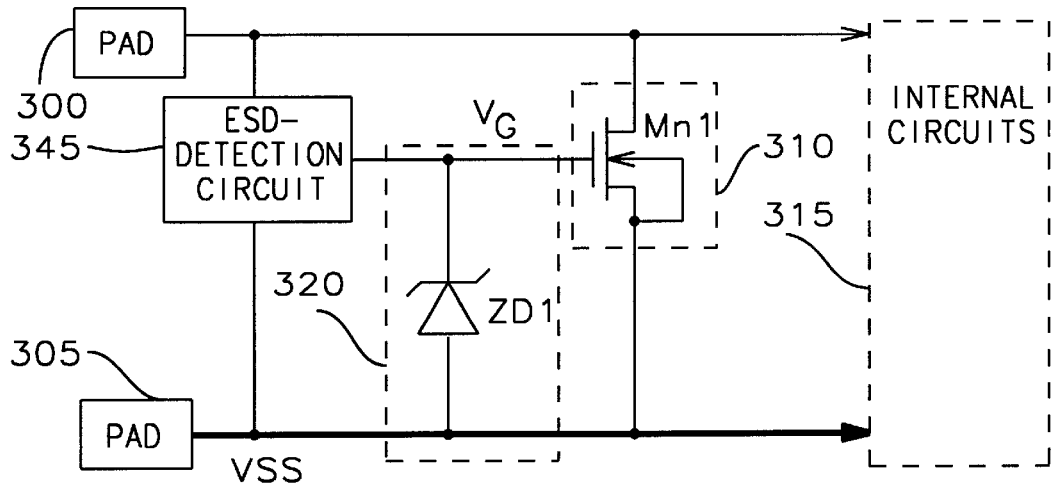

FIG. 16 illustrates the implementation of the voltage clamping circuit 320 as a zener diode ZD1. The anode of the zener diode ZD1 is connected to the output port VG of the ESD detection circuit 345 and the cathode is connected to the power supply terminal 305.

As described above, the voltage level present at the output port VG of the ESD detection circuit must be sufficiently large to activate the charge dissipation circuit 310. That is, the voltage level of the output port VG must be greater than the threshold voltage level VT of the charge dissipating NMOS transistor Mn1. Further, the maximum voltage present at the output port VG of the ESD detection circuit must be less than the voltage that will cause the formation of the surface channel 135 of FIG. 7. Therefore, the number of diodes D_1, D_2, D_3, ..., D_k is chosen to meet these requirements. Likewise, the avalanche breakdown voltage of the zener diode ZD1 is chosen to meet these requirements.

Figure 17:
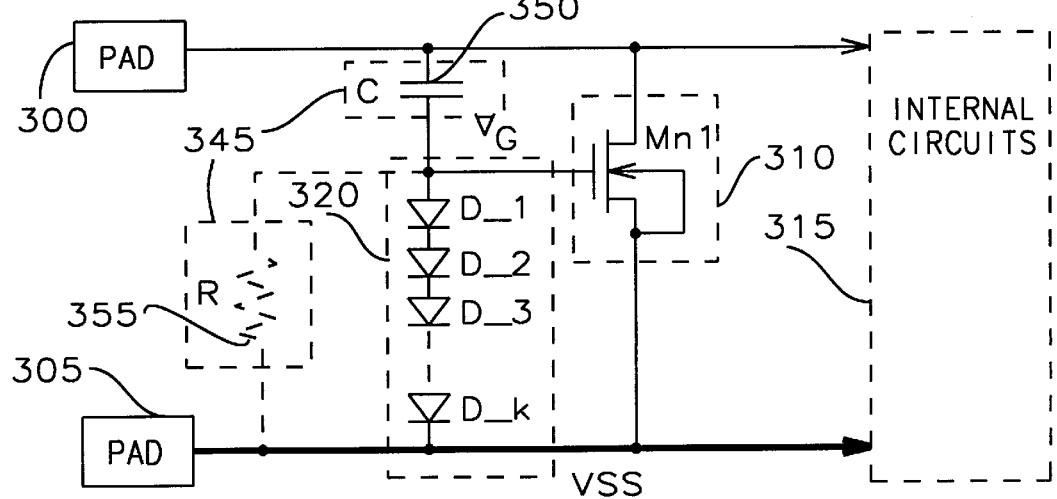

FIG. 17 shows an implementation of the ESD detection circuit 345. The capacitor C 350 is connected between the input signal terminal 300 and the output port VG of the ESD detection circuit 345. The resistor R 355 is optionally connected from the output port VG of the ESD detection circuit 345 and the power supply terminal 305 connected to the substrate biasing voltage source VSS. The function of the resistor R 355 is to develop the voltage level necessary to activate the ESD dissipation circuit 310. This can be performed by the voltage clamping circuit 320, thus making the resistor R 355 optional. It is apparent that all the above-described implementations of the voltage clamping circuit 320 can be substituted to perform the function of the optional resistor R 355.

Figure 18:
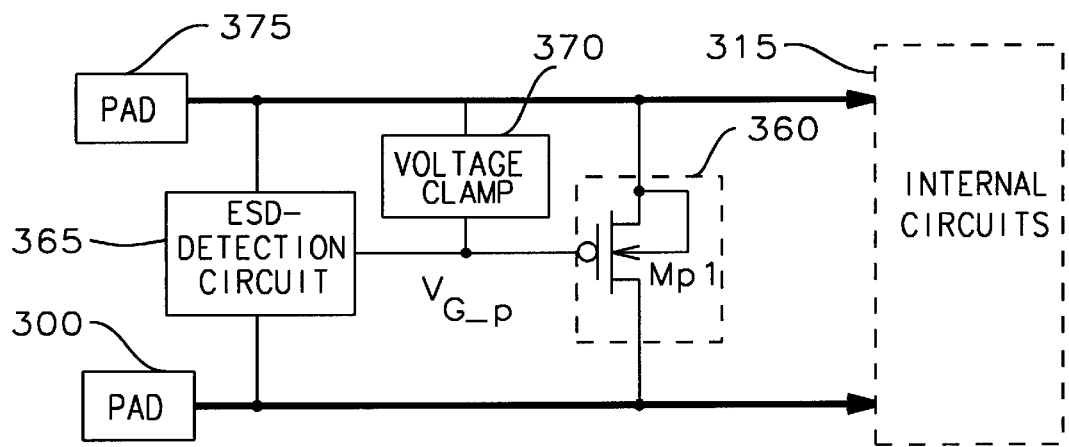

FIGS. 18–23 illustrate more variations of implementations of the first embodiment of the ESD protection circuit of this invention. In FIG. 18, the first terminal 300 is an input signal terminal to receive signals from external circuits. The second terminal 375 is the power supply terminal connected to the power supply voltage source VDD.

The charge dissipation circuit 360 is implemented as the PMOS transistor Mp1. The ESD protection PMOS transistor Mp1 360 has its drain connected to the input signal terminal 300 and its source connected to the power supply terminal 305 connected to the power supply voltage source VDD. The gate of the ESD protection PMOS transistor Mp1 360 is connected to the output port VG of the ESD detection circuit 365.

The voltage clamping circuit 370 is connected as described above between the output port VG of the ESD detection circuit 365 and the power supply terminal 375.

The charge dissipation circuit 360 of this implementation is an NMOS transistor having relatively large dimensions to minimize current density during the charge dissipation. The polarity of the voltage of the ESD source applied to the input signal terminal 300 is to be negative or alternately the polarity of the ESD source applied to the power supply terminal 375 is positive for the charge dissipation circuit 360 to operate properly.

Figure 19:
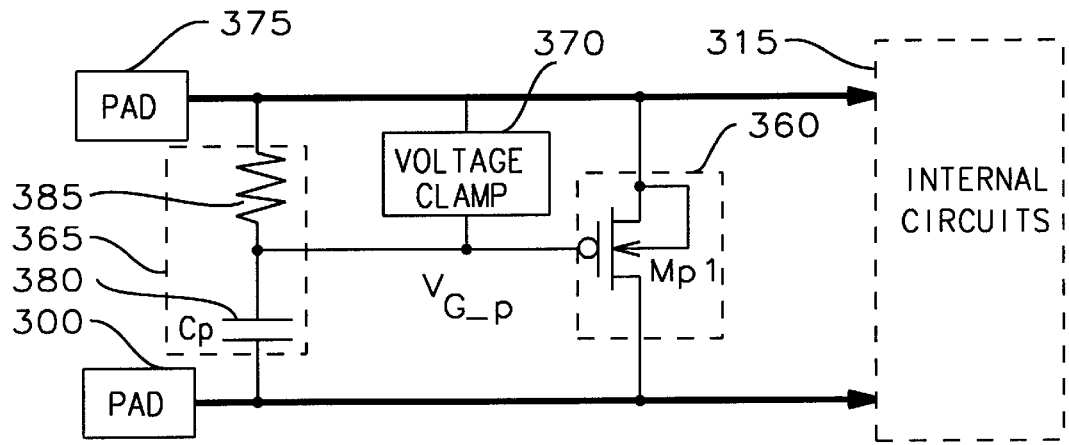

FIG. 19 illustrates an implementation of the ESD detection circuit 365. The resistor Rp 385 is connected between the power supply terminal 375 that is connected to the power supply voltage source VDD and the output port VG_p of the ESD detection circuit 365. The capacitor Cp 380 is connected between the input signal terminal 300 and the output port VG_p of the ESD detection circuit 365. If an ESD source having a negative polarity is brought in contact with the input signal terminal 300 or if an ESD source having a positive polarity is brought in contact with the power supply terminal 375, the voltage level of the ESD source induces a current to flow in the capacitor C 380 and through the resistor Rp 385. The voltage at the output port VG_p of the ESD detection circuit 365 is sufficient to turn on the ESD protection PMOS transistor Mp1 360. The voltage clamping circuit 370 prevents the voltage level developed at the output port VG_p of the ESD detection circuit 365 from exceeding a voltage level that will damage the ESD protection PMOS transistor Mp1 60.

Figure 20:
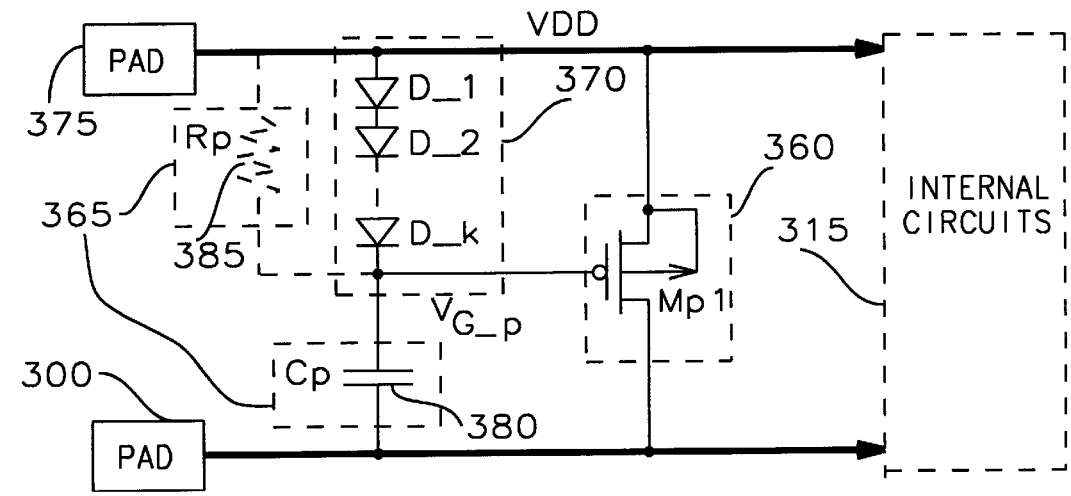
Figure 21:
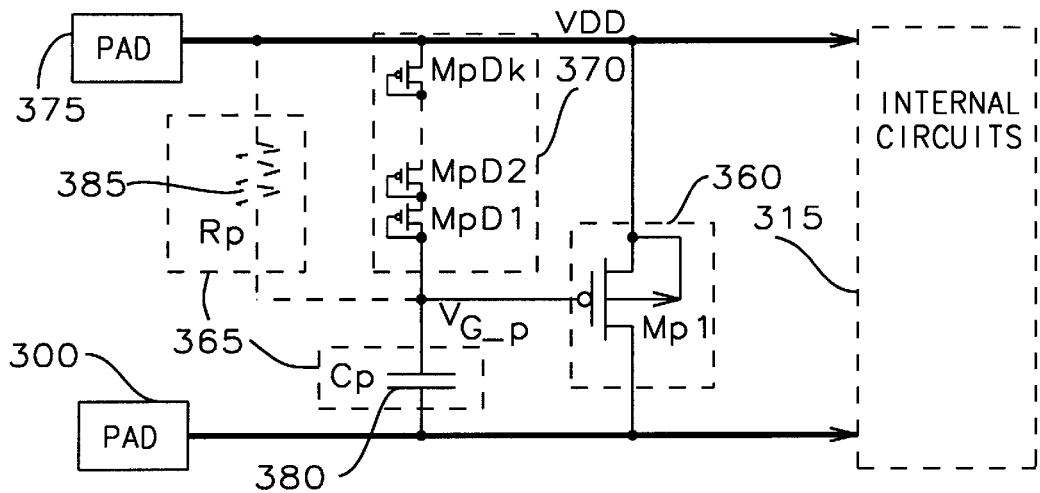

FIG. 20 illustrates an implementation of the voltage clamping circuit 370. The voltage clamping circuit 370 is a plurality of diodes Dp_1, Dp_2, Dp_3, . . . , Dp_k that are serially connected cathode to anode between the output port VG_p of the ESD detection circuit 370 and the power supply terminal 375 connected to the power supply voltage source VDD. The diodes of the voltage clamping circuit 370, as shown in FIG. 21, can be formed of diode-connected PMOS transistors MpD1, MpD2, MpD3, . . . , MpDk. The PMOS transistors MpD1, MpD2, MpD3, . . . , MpDk each have their gates and drains commonly connected to force the PMOS transistors MpD1, MpD2, MpD3, . . . , MpDk into diode operation. The diodes of the voltage clamping circuit 370, alternately, may be implemented as NMOS transistors. The NMOS transistors have their gates and drains commonly connected to force the NMOS transistors into diode operation.

Another implementation of the voltage clamping circuit 370 is as a zener diode. The anode of the zener diode is connected to the output port VG of the ESD detection circuit 365 and the cathode is connected to the power supply terminal 375.

As described above, the voltage level present at the output port VG of the ESD detection circuit must be sufficiently large to activate the charge dissipation circuit 360. That is, the voltage level of the output port VG must be greater than the threshold voltage VT of the ESD protection PMOS transistor Mp1. Further, the maximum voltage present at the output port VG of the ESD detection circuit 365 must be less than the voltage that will cause the formation of the surface channel 135 of FIG. 7. Therefore, the number of diodes Dp_1, Dp_2, Dp_3, . . . , Dp_k is chosen to meet these requirements. Likewise, the avalanche breakdown voltage of the zener diode is chosen to meet these requirements.

FIG. 20, additionally, shows an implementation of the ESD detection circuit 365. The capacitor Cp 380 is connected between the input signal terminal 300 and the output port VG of the ESD detection circuit 365. The resistor Rp 385 is optionally connected from the output port VG of the ESD detection circuit 365 and the power supply terminal 375 connected to the power supply voltage source VDD. The function of the resistor RP 385 is to develop the voltage level necessary to activate the ESD dissipation circuit. This can be performed by the voltage clamping circuit 370, thus making the resistor RP 385 optional. It is apparent that all the above-described implementations of the voltage clamping circuit 370 can be substituted to perform the function of the optional resistor RP 385.

Figure 22:
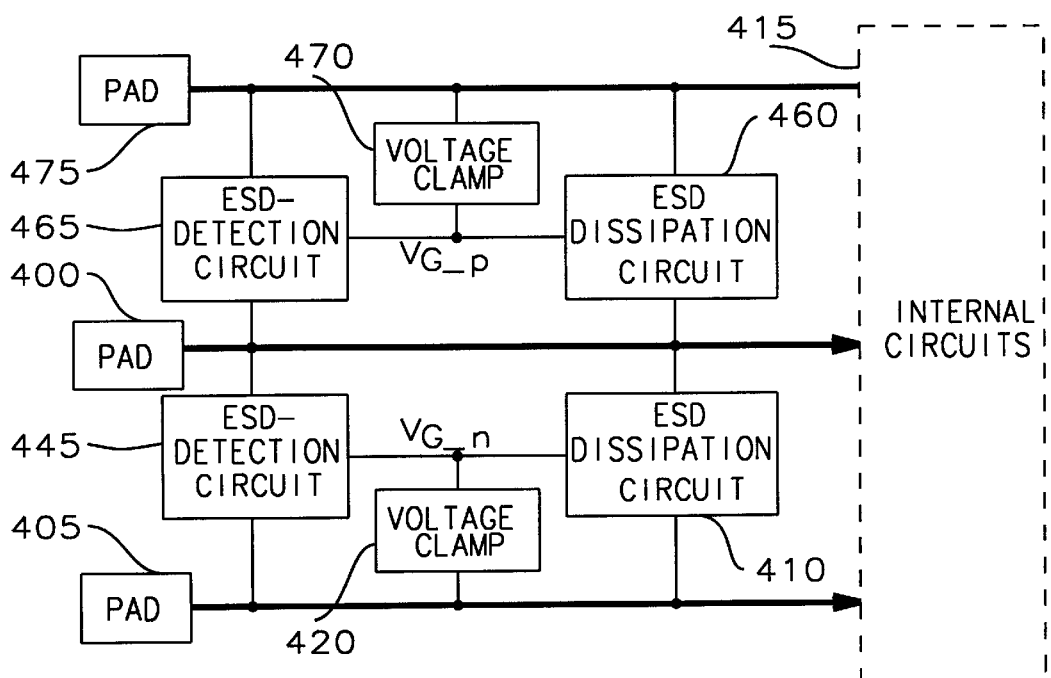
FIG. 22 is a block diagram of a second embodiment of an ESD protection circuit of this invention.

A second embodiment of this invention, as shown in FIG. 22, is to prevent damage to internal circuits 415 of an integrated circuit formed on a semiconductor substrate. The damage is caused by the application of a first ESD voltage source having a first polarity coupled between the first terminal 400 connected to the internal circuits 415 and the second terminal 405 connected to the internal circuits 415, or a second ESD voltage source having a polarity opposite that of the first polarity coupled between the first terminal 400 connected to the internal circuits 415 and the third terminal 475 connected to the internal circuits 415.

A first charge dissipation circuit 410 is connected between the first and second terminals 400 and 405 to dissipate the charge from the first ESD source. A second charge dissipation circuit 460 is connected between the first and third terminals 400 and 475 to dissipate the charge from the second ESD source.

A first ESD detection circuit 445 having a first input port connected to the first terminal 400 and a second input port connected to the second terminal 405 determines the presence of the first ESD source between the first and second terminals 400 and 405. When the first ESD source is present between the first and second terminals 400 and 405, an activation signal is placed on an output port of the first ESD detection circuit 445. The first ESD detection circuit 445 is connected to the activation port of the ESD dissipation circuit 410. When the activation signal is placed at the output port VG_n of the first ESD detection circuit 445, the first ESD dissipation circuit 410 is turned on to dissipate the charge from the first ESD source. As described above, the extreme voltage level of the ESD source will force the activation signal to be an excess level that will cause damage to the first ESD dissipation circuit 445.

To prevent formation of the excess level at the output port VG_n of the first ESD detection circuit 445 and thus damage to the first ESD dissipation circuit 410, a first voltage clamping circuit 420 is connected between the output port VG_n of the first ESD detection circuit 445 and the second terminal 405. The first voltage clamping circuit 420 sets the level of the activation signal to be sufficient to activate the first ESD dissipation circuit 410 but not so great as to damage the first ESD dissipation circuit 410.

A second ESD detection circuit 465 having a first input port connected to the first terminal 400 and a second input port connected to the third terminal 475 for determining the presence of the first ESD source between the first and third terminals 400 and 475. When the second ESD source is present between the first and third terminals 400 and 475, an activation signal is placed on an output port VG_p of the second ESD detection circuit 465. The second ESD detection circuit 465 is connected to the activation port of the second ESD dissipation circuit 460. When the activation signal is placed at the output port VG_p of the second ESD detection circuit 465, the second ESD dissipation circuit 460 is turned on to dissipate the charge from the second ESD source. As described above, the extreme voltage level of the second ESD source will force the activation signal to be an excess level that will cause damage to the second ESD dissipation circuit 465.

To prevent formation of the excess voltage level at the output port VG_p of the second ESD detection circuit 465 and thus damage to the second ESD dissipation circuit 460, a second voltage clamping circuit 470 is connected between the output port VG_p of the second ESD detection circuit 465 and the third terminal 475. The second voltage clamping circuit 470 sets the level of the activation signal to be sufficient to activate the second ESD dissipation circuit 460 but not so great as to damage the second ESD dissipation circuit 460.

Figure 23:
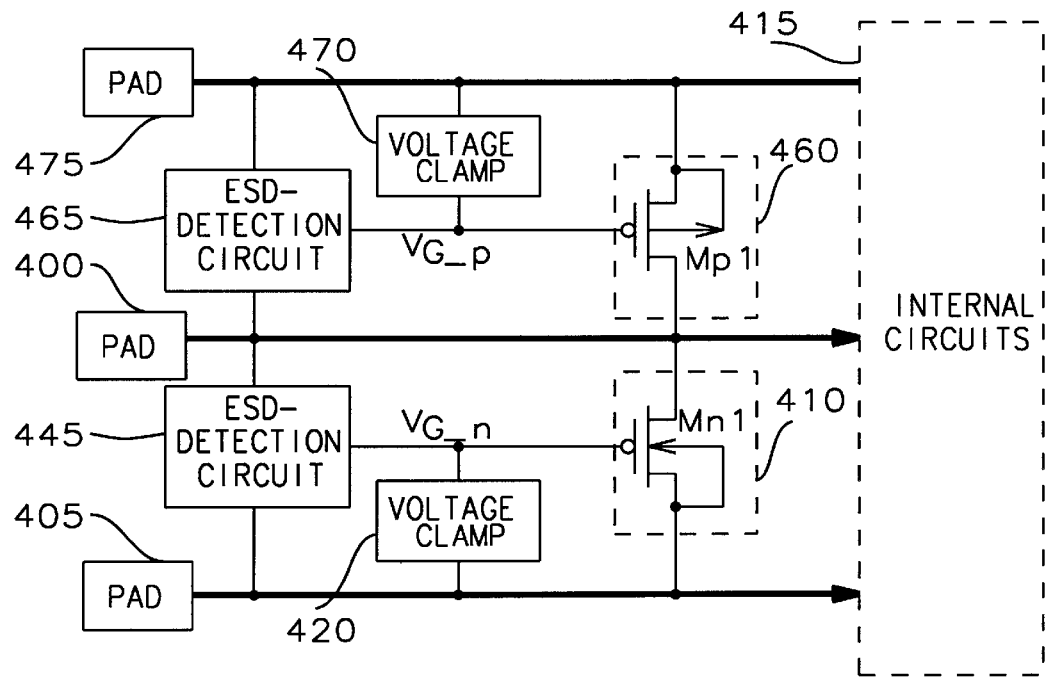
FIGS. 23–26 are schematic diagrams of various implementations of embodiments of a second embodiment of an ESD protection circuit of this invention.

FIG. 23 shows an implementation of the second embodiment of this invention where the first charge dissipation circuit 460 is an NMOS transistor Mn1 having relatively large dimensions capable of handling the current during the discharge of the first ESD source.

The drain of the charge dissipating NMOS transistor Mn1 is connected to the first terminal 400 which is usually an input signal terminal and the source is connected to the second terminal 405 which is a power supply terminal connected to the substrate biasing voltage source VSS. The gate of the charge dissipating NMOS transistor Mn1 is connected to the output port VG_n of the first ESD detection circuit 445.

The first voltage clamping circuit 420 must insure that the voltage level of the output port VG_n of the first ESD detection circuit 445 is greater than the threshold voltage VT of the charge dissipating NMOS transistor Mn1 but less than the gate voltage level that will form the surface channel 135 of FIG. 7.

Further, the implementation of the second embodiment of this invention has the second charge dissipation circuit formed as a PMOS transistor Mp1 having relatively large dimensions capable of handling the current during the discharge of the second ESD source.

The drain of the ESD protection PMOS transistor Mp1 is connected to the first terminal 400, which is the input signal terminal, and the source is connected to the third terminal 475, which is a power supply terminal connected to power supply voltage source VDD. The gate of the ESD protection PMOS transistor Mp1 is connected to the output port VG_p of the second ESD detection circuit 465.

The second voltage clamping circuit 470 must insure that the voltage level of the output port VG_p of the second ESD detection circuit 465 is greater than the threshold voltage of the ESD protection PMOS transistor Mp1 but less than the gate voltage level that will form the surface channel analogous to the surface channel 135 shown in FIG. 7.

Figure 24:
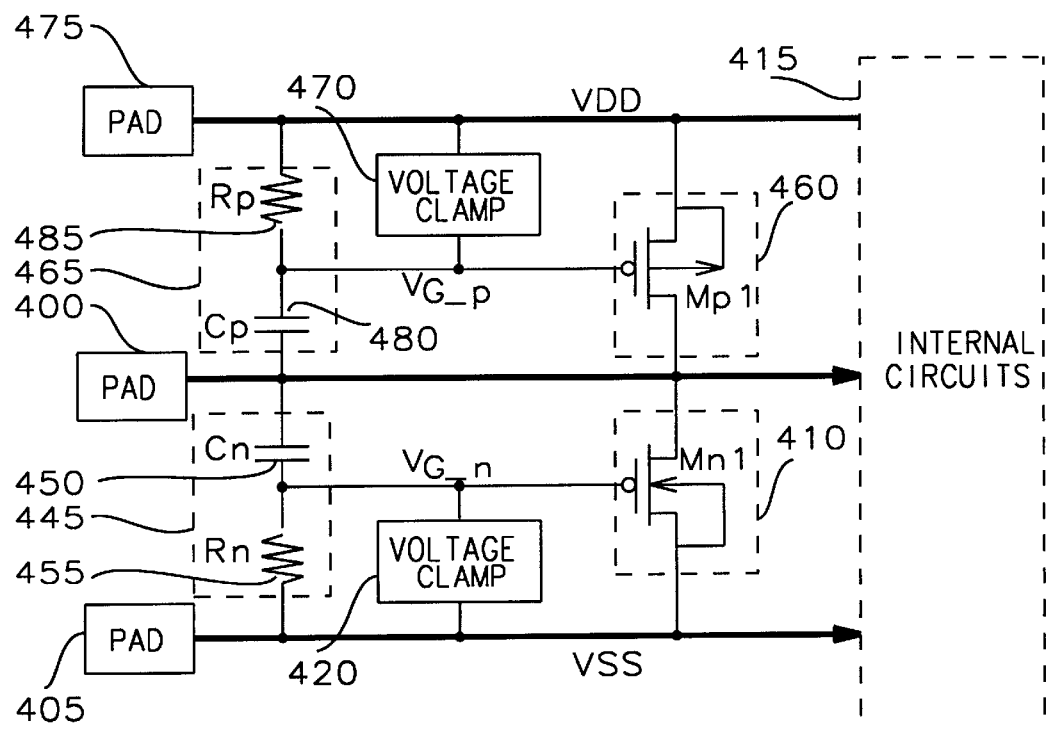

FIG. 24 demonstrates an implementation of the second embodiment of this invention where the first ESD detection circuit 445 is composed of the capacitor Cn 450 and the resistor Rn 455. The second ESD detection circuit 465 is composed of the capacitor Cp 480 and the resistor Rp 485.

The capacitor Cn 450 is connected between the input signal terminal 400 and the output port VG_n of the first ESD detection circuit 445. The resistor Rn 455 is connected between the output port VG_n of the first ESD detection circuit 445 and the power supply terminal 405 connected to the substrate biasing voltage source VSS.

When the first ESD voltage source is brought in contact with the input signal terminal 400, a current is induced through the capacitor Cn 450. The current is conducted through the resistor Rn 455 to develop the activating signal at the output port VG_n of the first ESD detection circuit 445. The voltage clamping circuit 420 will operate to prevent the activating signal from exceeding the voltage level that is established to prevent damage to the charge dissipating NMOS transistor Mn1.

The capacitor Cp 480 is connected between the input signal terminal 400 and the output port VG_p of the second ESD detection circuit 465. The resistor Rp 485 is connected between the output port VG_p of the second ESD detection circuit 465 and the power supply terminal 475 connected to the power supply voltage source VDD.

When the second ESD voltage source is brought in contact with the input signal terminal 400, a current is induced through the capacitor Cn 450. The current is conducted through the resistor Rp 485 to develop the activating signal at the output port VG_p of the second ESD detection circuit 465. The voltage clamping circuit 470 will operate to prevent the activating signal from exceeding the voltage level that is established to prevent damage to the ESD protection PMOS transistor Mp1.

Figure 25:
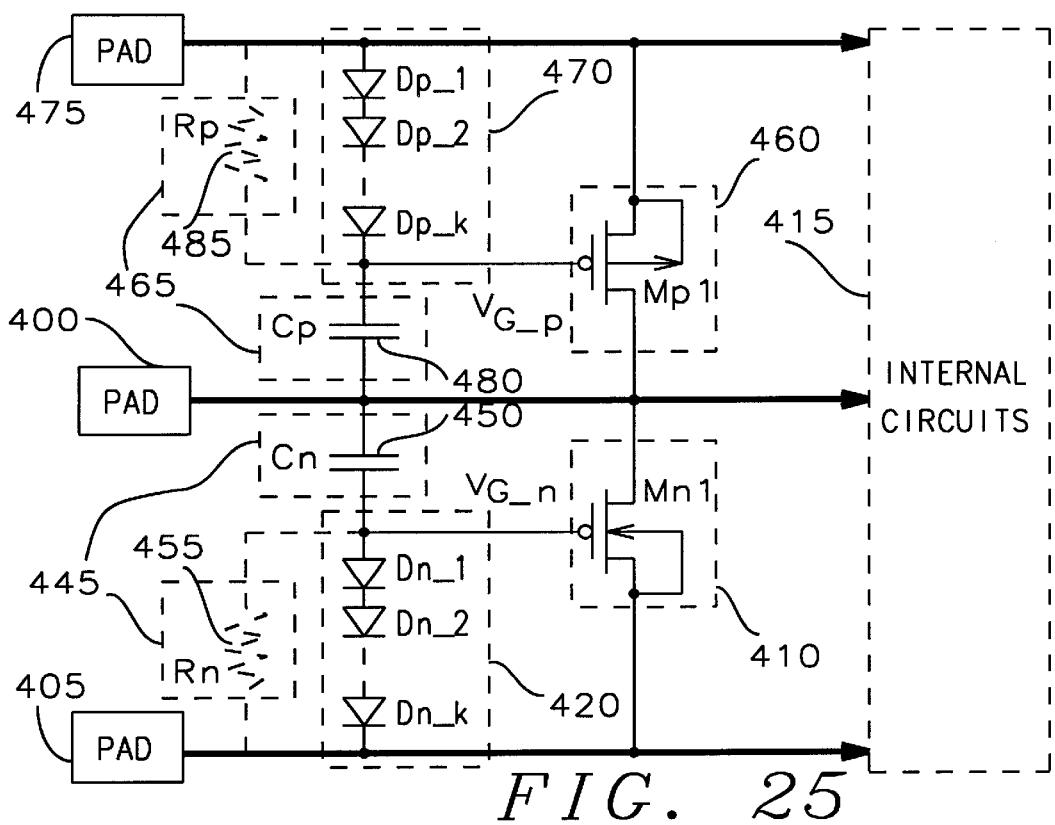

The first voltage clamping circuit 420 and the second voltage clamping circuit 470 each are composed of a plurality of diodes Dn_1, Dn_2, Dn_3, ..., Dn_k and Dp_1, Dp_2, Dp_3, ..., Dp_k serially connected cathode to anode as shown in FIG. 25. The diodes Dn_1, Dn_2, Dn_3, ..., Dn_k of the first voltage clamping circuit are connected between the output port VG_n of the ESD detection circuit 420 and the power supply terminal 405 connected to the substrate biasing voltage source VSS. The diodes Dp_1, Dp_2, Dp_3, ..., Dp_k of the second voltage clamping circuit 470 are connected between the power supply terminal 475 connected to the power supply voltage source VDD and the and the output port VG_p of the second ESD detection circuit 470.

Figure 26:
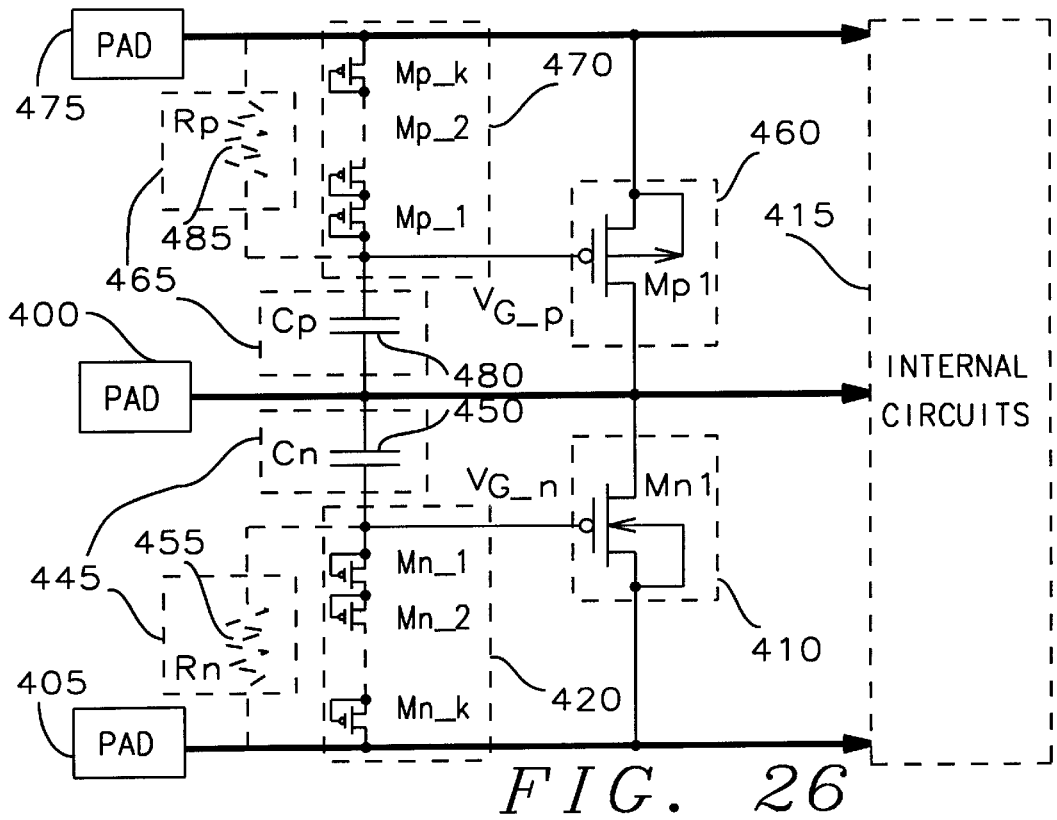

The diodes of the voltage clamping circuit 420 and the diodes of the voltage clamping circuit 470, as shown in FIG. 26, can be formed respectively of diode-connected NMOS transistors MnD1, MnD2, MnD3, ..., MnDk and of diode-connected PMOS transistors MpD1, MpD2, MpD3, ..., MpDk. The NMOS transistors MnD1, MnD2, MnD3, ..., MnDk and the PMOS transistors MpD1, MpD2, MpD3, ..., MpDk each have their gates and drains commonly connected to force the NMOS transistors MnD1, MnD2, MnD3, ..., MnDk and the PMOS transistors MpD1, MpD2, MpD3, ..., MpDk into diode operation. The diodes of the voltage clamping circuits 420 and 470, alternately, may be implemented respectively as PMOS transistors and as NMOS transistors. The PMOS and NMOS transistors have their gates and drains commonly connected to force the PMOS and NMOS transistors into diode operation.

Another implementation of the voltage clamping circuit 420 and the voltage clamping circuit 470 are as zener diodes. The cathode of the zener diode that would form the voltage clamping circuit 420 is connected to the power supply terminal 475 and the anode of the zener diode that would form the voltage clamping circuit 420 is connected to the output port VG_p of the ESD detection circuit 465, while the cathode of the zener diode that would form the voltage clamping circuit 470 is connected to the output port VG_p of the ESD detection circuit 465 and the anode of the zener diode that would form the voltage clamping circuit 470 is connected to the power supply terminal 475.

As described above, the voltage level present at the output port VG_n of the ESD detection circuit 445 or the output port VG_p of the ESD detection circuit 465 must be sufficiently large to activate the charge dissipation circuit 410 or the charge dissipation circuit 460. That is, the voltage level of the output port VG_n must be greater than the threshold voltage VT of the charge dissipating NMOS transistor Mn1 and the voltage level of the output port VG_p must be greater than the threshold voltage VT of the ESD protection PMOS transistor Mp1. Further, the maximum voltage present at the output port VG_n of the ESD detection circuit 455 must be less than the voltage that will cause the formation of the surface channel 135 of FIG. 7. Likewise, the maximum voltage present at the output port VG_p of the ESD detection circuit 465 must be less than the voltage that will cause the formation of the surface channel that is analogous to the surface channel 135 of FIG. 7. Therefore, the number of diodes Dn_1, Dn_2, Dn_3, ..., Dn_k and Dp_1, Dp_2, Dp_3, ..., Dp_k is chosen to meet these requirements. Likewise, the avalanche breakdown voltage of the zener diode is chosen to meet these requirements.

FIGS. 25 and 26, additionally, shows an implementation of the ESD detection circuits 445 and 465. The capacitor Cn 450 is connected between the input signal terminal 400 and the output port VG_n of the ESD detection circuit 445. The resistor Rn 455 is optionally connected from the output port VG_n of the ESD detection circuit 445 and the power supply terminal 445 connected to the substrate biasing voltage source VSS. The function of the resistor Rn 455 is to develop the voltage level necessary to activate the ESD dissipation circuit 410. This can be performed by the voltage clamping circuit 420, thus making the resistor Rn 455 optional. It is apparent that all the above-described implementations of the voltage clamping circuit 420 can be substituted to perform the function of the optional resistor Rn 455. Similarly, the capacitor Cp 480 is connected between the input signal terminal 300 and the output port VG_p of the ESD detection circuit 465. The resistor Rp 485 is optionally connected from the output port VG_p of the ESD detection circuit 465 and the power supply terminal 475 connected to the power supply voltage source VDD. The function of the resistor Rp 485 is to develop the voltage level necessary to activate the ESD dissipation circuit 460. This can be performed by the voltage clamping circuit 470, thus making the resistor Rp 485 optional. It is apparent, also, that all the above-described implementations of the voltage clamping circuit 470 can be substituted to perform the function of the optional resistor Rp 485.

Figure 27:
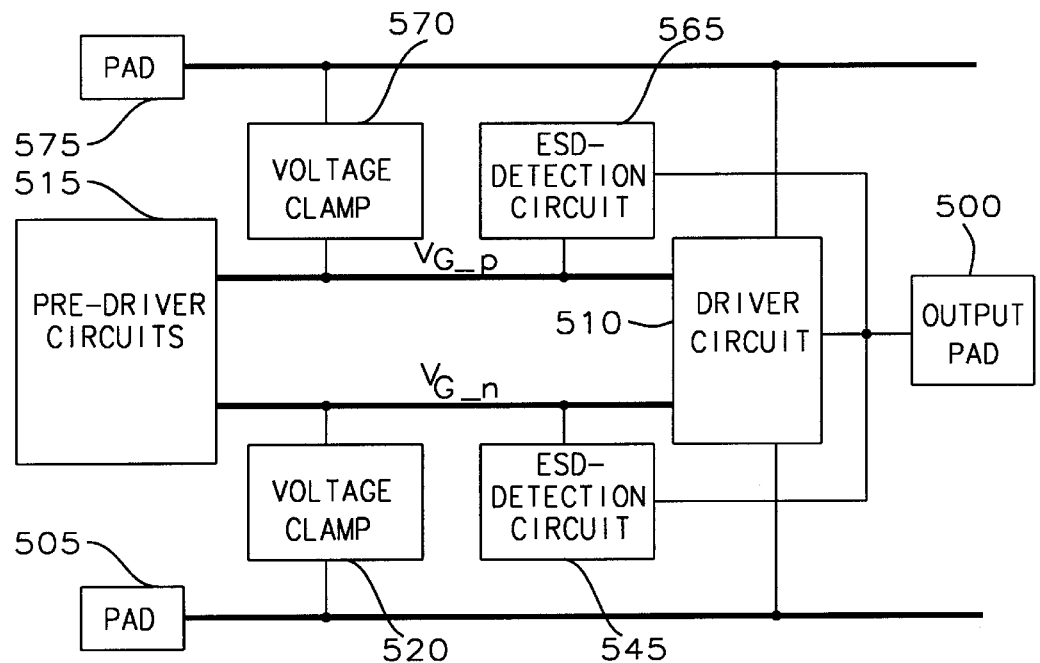
FIG. 27 is a schematic diagram of an output driver circuit incorporating an embodiment of the ESD protection circuit of this invention.

A third embodiment of this invention, as shown in FIG. 27, is an output driver circuit incorporating the ESD protection features of this invention. The driver circuit 510 is an amplifier connected between the power supply terminal 575 connected to the power supply voltage source VDD and the power supply terminal 505 connected to the substrate biasing voltage source VSS. The driver circuit 510 further is connected to the internal pre-driver circuits 515 and to the output signal terminal 500. The driver circuit 510 will create the appropriate current and voltage levels from the electrical signals provided by the internal pre-driver circuits 515 to transfer the electrical signals to the external circuitry connected to the output signal terminal 500. Additionally, the driver circuit 510 of this invention will dissipate any charge present at the output signal terminal 500 from an ESD source coupled between the output signal terminal 500 and either the power supply terminal 575 or the power supply terminal 505. This is to prevent damage to the internal circuits of the integrated circuit on which the output driver circuit is formed.

The output driver circuit of this invention has a first ESD detection circuit 545 connected between the output signal terminal 500 and the first output signal port VG_n of the pre-driver circuit 515. A second ESD detection circuit 565 is connected between the output signal terminal 500 and the second output signal port VG_p of the pre-driver circuit 515.

If an ESD source having a voltage level of a first polarity is coupled to the output signal terminal 500, the first ESD detection circuit 565 senses the voltage level of the first polarity and applies a first activation signal to the first output signal port VG_n. The driver circuit is activated and the charge present on the ESD source is dissipated preventing the damage. However, if the voltage level present on the ESD source has a polarity opposite the first polarity, the second ESD detection circuit 565 senses the voltage level of the ESD source and places a second activation signal at the second output signal port of the internal pre-driver circuit 515. The driver circuit 510 is again activated to dissipate the charge from the ESD source.

As described previously, the voltage level of the ESD source is extremely high and the first and second ESD detection circuits 545 and 565 develop the first and second activation signals that are proportional to the voltage level of the ESD source. Thus, the first and second activation signals have voltage levels that cause damage to the driver circuit. To prevent this damage, a first voltage clamping circuit 520 is connected between the first output signal port VG_n and the first power supply terminal 505 that is connected to the substrate biasing voltage source VSS. Additionally, a second voltage clamping circuit 570 is connected between the second output signal port VG_p of the pre-driver circuit 515 and the power supply terminal 575 connected to the power supply voltage source VDD.

The voltage levels of the first and second output signal ports VG_n and VG_p must be large enough to activate the driver circuit 510, but when the voltage levels of the first and second output signal ports VG_n and VG_p begin to approach the voltage level at which the driver circuit 510 can be damaged, the appropriate voltage clamping circuits 520 and 570 are activated to prevent the voltage level attaining the voltage level that causes damage to the driver circuit 510.

Figure 28:
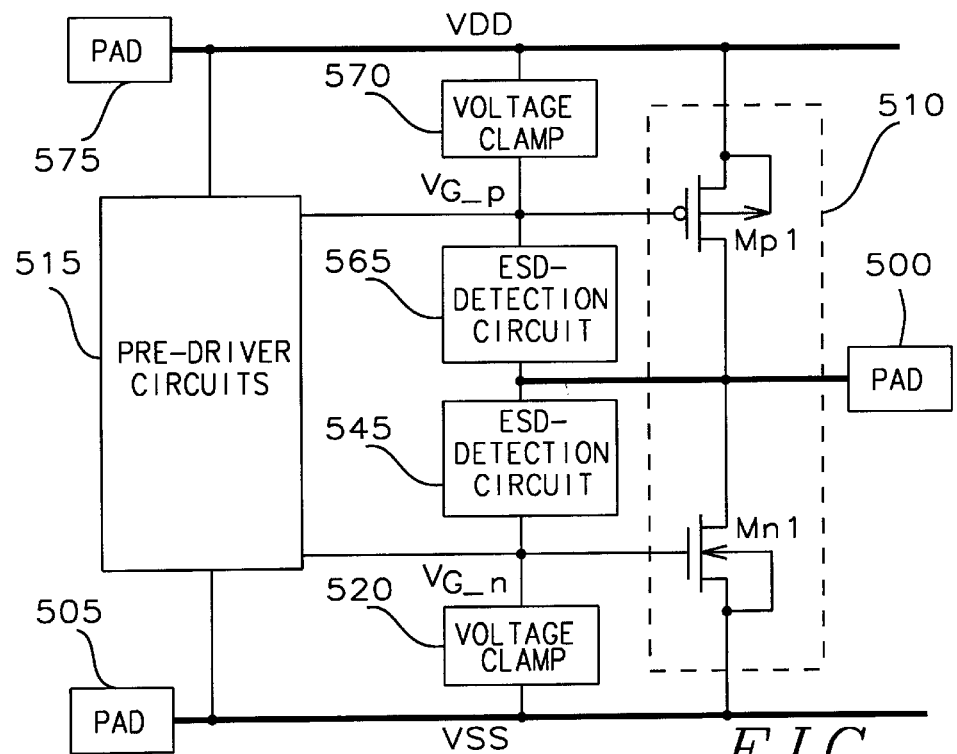
FIGS. 28–30 are schematic diagrams of implementations of the output driver circuit of FIG. 27.
Figure 29:
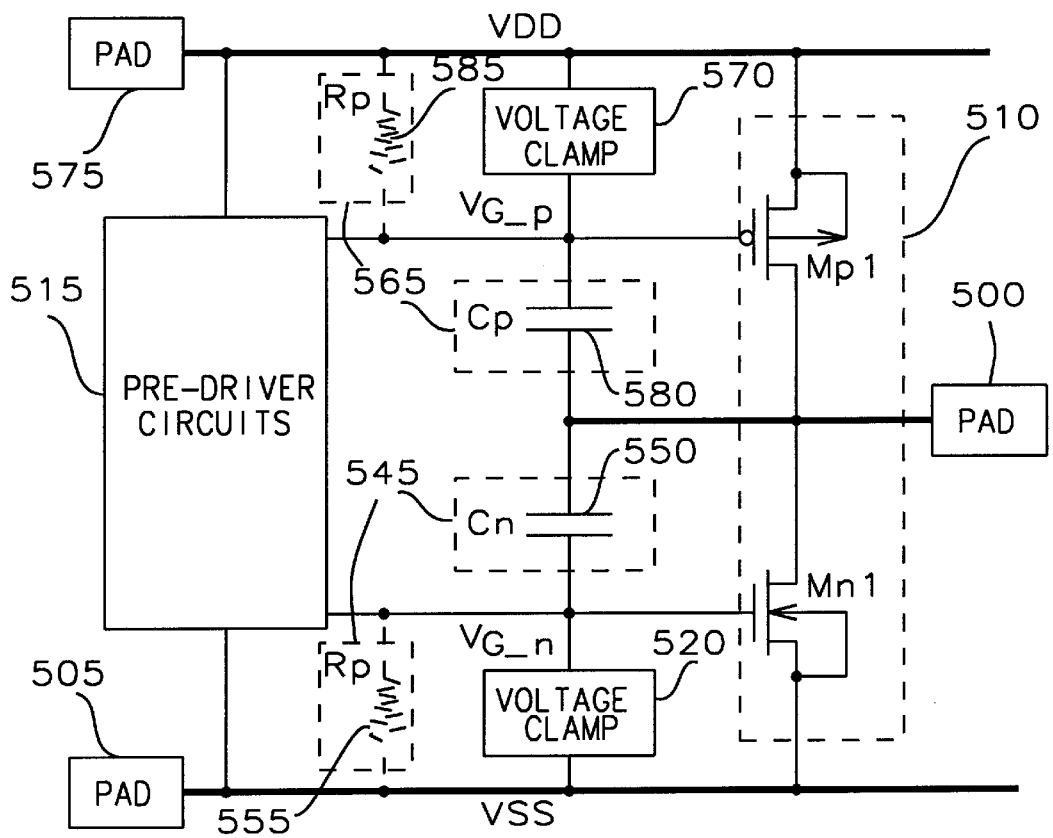
Figure 30:
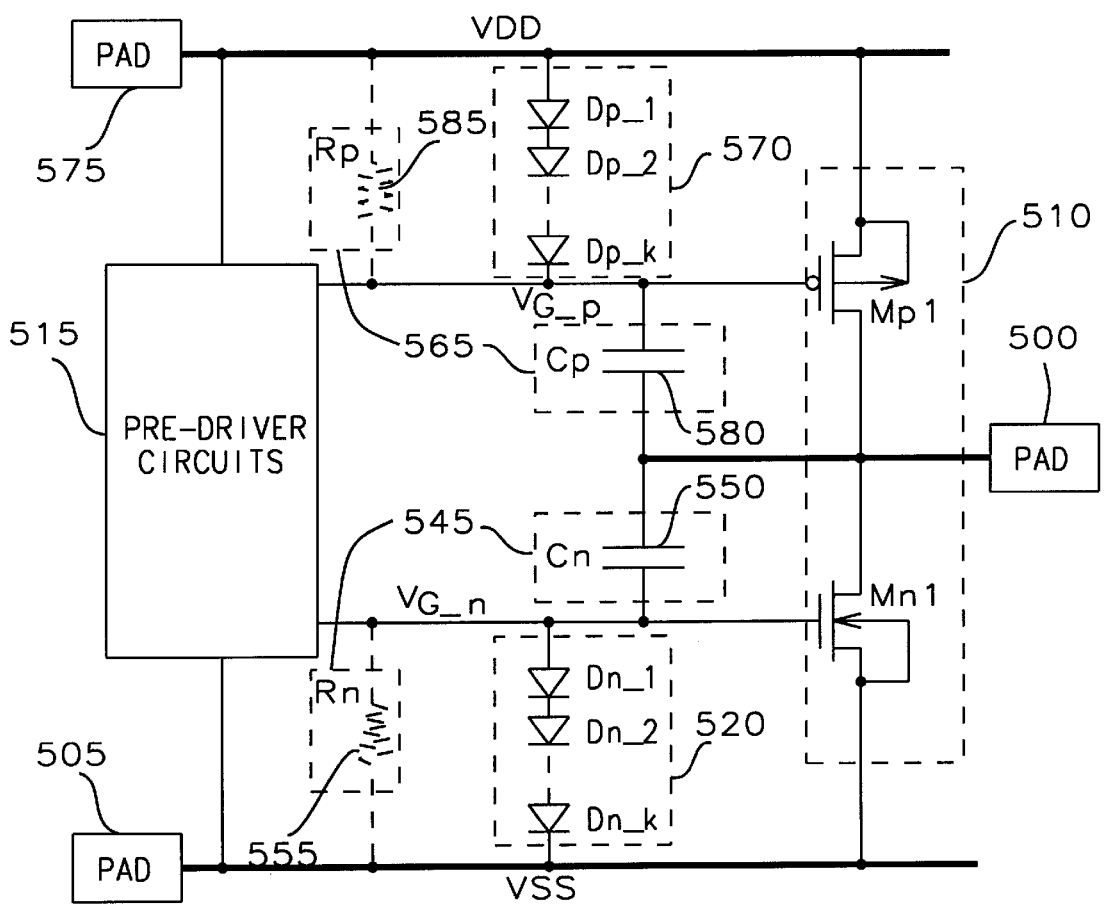

FIGS. 28–30 illustrate a number of implementations of the output driver circuit of this invention. The driver circuit 510 of the implementation shown in FIG. 28 is formed by the NMOS transistor Mn1 and the PMOS transistor Mp1. Both the NMOS transistor Mn1 and the PMOS transistor Mp1 have relatively large dimensions to carry large currents required for driving large capacitive loads of circuits external to the integrated circuit and for dissipating charge from an ESD source coupled to the output signal terminal 500.

The NMOS transistor Mn1 has its drain connected to the output signal terminal 500 and its source connected to the first power supply terminal 505 that is connected to the substrate biasing voltage source VSS. The gate of the NMOS transistor Mn1 is connected to the first output signal port VG_n of the internal pre-driver circuit 515. When an ESD source having a positive polarity is coupled to the first output signal terminal 500, the first ESD detection circuit 545 places the first activation signal on the second output signal port VG_n of the pre-driver circuit 515. If the voltage level of the first activation signal is too large, a surface channel 135 of FIG. 7 is formed in the NMOS transistor Mn1 and damage will occur to the NMOS transistor Mn1. To prevent this, the first voltage clamping circuit 520 activates and maintains the voltage level of the first output signal port VG_n at a level less than the voltage level that can cause the damage.

The PMOS transistor Mp1 has its drain connected to the output signal terminal 500 and its source connected to the second power supply terminal 575 that is connected to the power supply voltage source VDD. The gate of the PMOS transistor Mp1 is connected to the second output signal port VG_p of the internal pre-driver circuit 515. When an ESD source having a negative polarity is coupled to the first output signal terminal 500, the second ESD detection circuit 565 places the second activation signal on the second output signal port VG_p of the pre-driver circuit 515. If the voltage level of the second activation signal is too large, a surface channel analogous to the surface channel 135 of FIG. 7 is formed in the PMOS transistor Mp1 and damage will occur to the PMOS transistor Mp1. To prevent this, the second voltage clamping circuit 570 activates and maintains the voltage level of the second output signal port VG_p at a level less than the voltage level that can cause the damage.

An implementation of the first ESD detection circuit 545 and the second ESD detection circuit 565 are shown in FIG. 29. The first capacitor Cn 550 and the optional first resistor Rn 555 form the first ESD detection circuit 545. The second capacitor CP 580 and the optional second resistor Rp 585 form the second ESD detection circuit 565.

When the ESD source having the positive polarity is coupled to the output signal terminal 500 a current is induced in the capacitor Cn 550 and flows through the optional resistor Rn 555 to form the first activating signal. The current induced in the capacitor Cn 550 can alternately flow through the first voltage clamping circuit 520, thus explaining why the first resistor Rn 55 is optional. Alternately, when the ESD source having a negative polarity is coupled to the output signal terminal 500, a current is now induced to the second capacitor Cp 580. The current flows through the optional second resistor Rp 585 to develop the second activating signal. The current induced in the capacitor Cp 580 can alternately flow through the second voltage clamping circuit 570, also explaining why the second resistor Rp 585 is optional.

FIG. 30 shows an implementation of the first voltage clamping circuit 520 implement ed as the plurality of diodes Dn_1, Dn_2, Dn_3, . . . , Dn_k with the diodes serially connected cathode to anode. The second voltage clamping circuit 570 is implemented as the plurality of diodes Dp_1, Dp_2, Dp_3, . . . , Dp_k also serially connected cathode to anode. The serially connected diodes Dn_1, Dn_2, Dn_3, . . . , Dn_k are connected between the first output signal port VG_n of the internal pre-driver circuit 515 and the first power supply terminal 505 connected to the substrate biasing voltage source VSS. And the serially connected diodes Dp_1, Dp_2, Dp_3, . . . , Dp_k are connected between the second output signal port VG_p of the internal pre-driver circuit 515 and the second power supply terminal 575 connected to the power supply voltage source VDD.

When the ESD source having a positive polarity is coupled to the output signal terminal 500 and the current is induced through the first capacitor Cn 550, the voltage level of the first output signal port VG_n is clamped to the voltage level determined by the number of serially connected diodes Dn_1, Dn_2, Dn_3, . . . , Dn_k. Similarly, when the ESD source having the negative polarity is coupled to the output signal terminal 500 and the current is now induced in the second capacitor Cp 580, the voltage level of the second output signal port Vg_p is clamped to the voltage level determined by the number of serially connected diodes Dp_1, Dp_2, Dp_3, . . . , Dp_k.

It is apparent that each diode of the serially connected diodes Dn_1, Dn_2, Dn_3, . . . , Dn_k and Dp_1, Dp_2, Dp_3, . . . , Dp_k can be formed by either an NMOS transistor or a PMOS transistor having its source and drain connected to force diode operation. This structure is equivalent to the voltage clamping circuit 320 illustrated in FIGS. 14 and 15. It is further apparent that the first voltage clamping circuit 520 and be implemented as zener diodes as shown in FIG. 16. The second voltage clamping circuit 570 can be implemented similarly as a zener diode having its anode connected to the second output signal port VG_p and its cathode connected to the second power supply terminal 575 connected to the power supply voltage source VDD.

As described before, the voltage level present at the first output signal port VG_n must be sufficiently large to activate the charge dissipation circuit 510 and similarly the voltage level present at the second output signal port VG_p must be sufficiently large to activate the ESD detection circuit 510. However, the maximum voltages present at the first and second output signal port VG_n and VG_p must be less than the voltage that causes the formation of the surface channel in either the NMOS transistor Mn1 or the PMOS transistor Mp1. The number of serially connected diodes Dn_1, Dn_2, Dn_3, . . . , Dn_k must be chosen to meet these requirements. If the first and second voltage clamping circuits 520 and 570 are implemented as zener diodes, the avalanche breakdown voltage must be chosen to also meet the above requirements.

While the charge dissipation circuit 510 is shown as a CMOS driver having the NMOS transistor Mn1 and the PMOS transistor Mp1, it is apparent to those skilled in the art that the pre-driver circuit 515 could activate either the NMOS transistor Mn1 or the PMOS transistor Mp1 singly, thus making the output driver circuit operate in an open drain mode or a source-follower mode.

Figure 31:
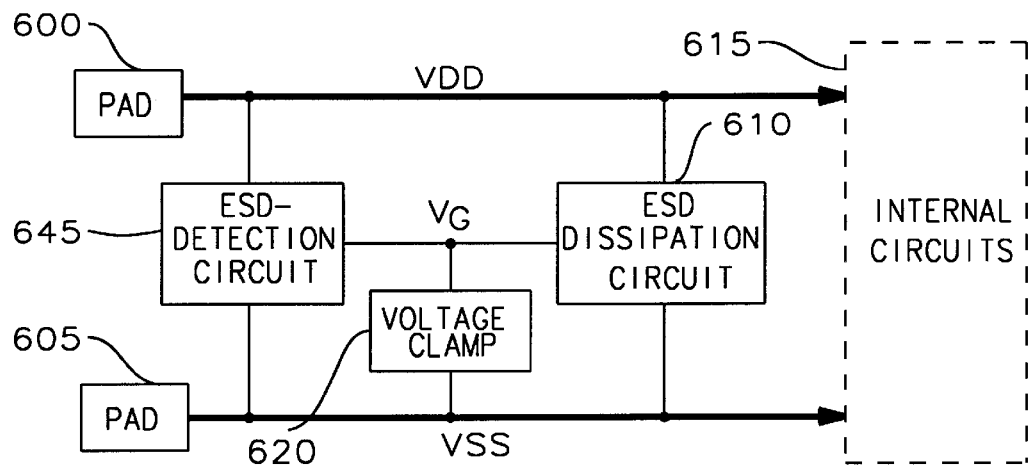
FIG. 31 is a schematic diagram of a fourth embodiment of the ESD protection circuit of this invention connected between two power supply terminals of an integrated circuit.

FIG. 31 illustrates a fourth embodiment of this invention. In this embodiment, the ESD dissipation circuit 610 is connected between the first power supply terminal 600 that is connected to the power supply voltage source VDD and the second power supply terminal 605 that is connected to the substrate biasing voltage source VSS. As described herein before, the ESD dissipation circuit 610, when activated, will allow a current to flow from the ESD source connected between the first power supply terminal 600 and the second power supply terminal 605 to dissipate any charge from the ESD source to prevent damage to the internal circuit 615 of the integrated circuits. The ESD detection circuit 645 has a first input port connected to the first power supply terminal 600 and a second input port connected to the second power supply terminal 605. When the ESD source is coupled between the first and second power supply terminals 600 and 605, the ESD detection circuit 645 places an activation signal at the output port VG to engage the ESD dissipation circuit 610.

As described above, the extreme voltage level of the ESD source causes the voltage level at the output port VG to be sufficiently excessive to cause damage to the ESD dissipation circuit 610. The voltage clamping circuit 620 is connected between the output port VG of the ESD detection circuit 645 and the second power supply terminal 605 that is connected to the substrate biasing voltage source VSS. The voltage clamping circuit 620 prevents the voltage level at the output port VG of the ESD detection circuit 645 from exceeding a voltage level that will damage the ESD dissipation circuit 610.

Figure 32:
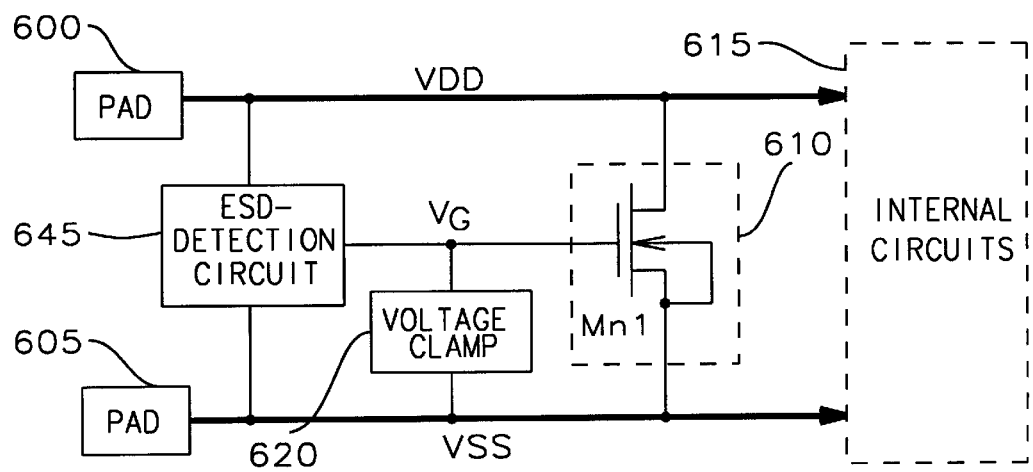
FIGS. 32–42 are schematic diagrams of various implementations of the fourth embodiment of the ESD protection circuit of this invention.

The ESD dissipation circuit 610, as shown in FIG. 32, is implemented as the NMOS transistor Mn1 having relatively large dimensions to accommodate the current necessary to dissipate the charge of the ESD source. The drain of the NMOS transistor Mn1 is connected to the first power supply terminal 600 that is connected to the power supply voltage source VDD and the source of the NMOS transistor Mn1 is connected to the second power supply terminal 605 that is connected to the substrate biasing voltage source VSS. The gate of the NMOS transistor Mn1 is connected to the output port VG of the ESD detection circuit 645.

If an ESD source having a positive polarity is coupled to the first power supply terminal 600 or an ESD source having a negative polarity is connected to the second power supply terminal 605, the ESD detection circuit 645 places the activation signal at the output port VG to turn on the NMOS transistor Mn1. The voltage clamping circuit 620 will prevent the activation signal from attaining a voltage level that will cause the formation of the surface channel 135 of FIG. 7.

Figure 33:
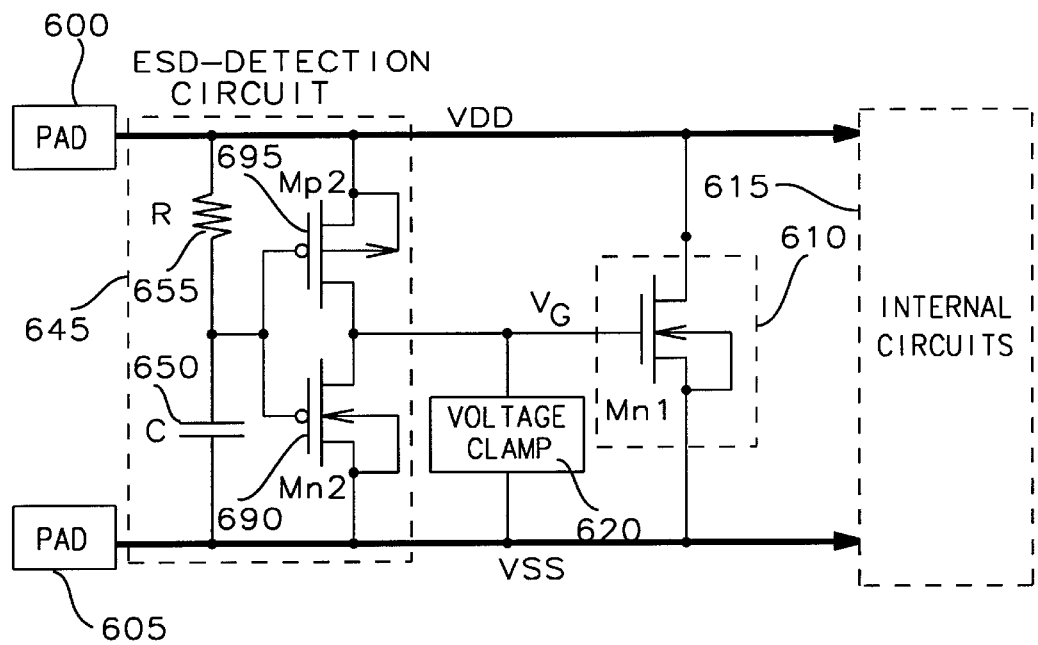

FIG. 33 illustrates a second embodiment of the ESD detection circuit 645. The ESD detection circuit 645 has an NMOS transistor Mn2 690 and a PMOS transistor Mp2 695. The source of the PMOS transistor Mp2 695 is connected to the power supply terminal 600 that is connected to the power supply voltage source VDD and the source of the NMOS transistor Mn2 690 is connected to the power supply terminal 605 which is connected to the substrate biasing voltage source VSS. The drains of the NMOS transistor Mn2 690 and the PMOS transistor Mp2 695 are connected to the output port VG of the ESD detection circuit 645.

The resistor R 655 is connected between the power supply terminal 600 and the gates of the NMOS transistor Mn2 690 and the PMOS transistor Mp2 695. The capacitor C 650 is connected between the gates of the NMOS transistor Mn2 690 and the PMOS transistor Mp2 695 and the second power supply terminal 605.

When the ESD source is coupled between the first and second power supply terminal 600 and 605, a current is induced in the capacitor C 650. The current flows in the resistor R 655 to develop a voltage sufficient to turn off the NMOS transistor Mn2 690 and to turn on the PMOS transistor Mp2 695, thus placing the activation signal at the output port VG and turning on the ESD dissipation circuit 610.

It is apparent that the voltage level of the activation signal would approach the voltage level of the ESD source, if it were not for the voltage clamping circuit 620 activating and fixing the voltage level of the activation signal.

Figure 34:
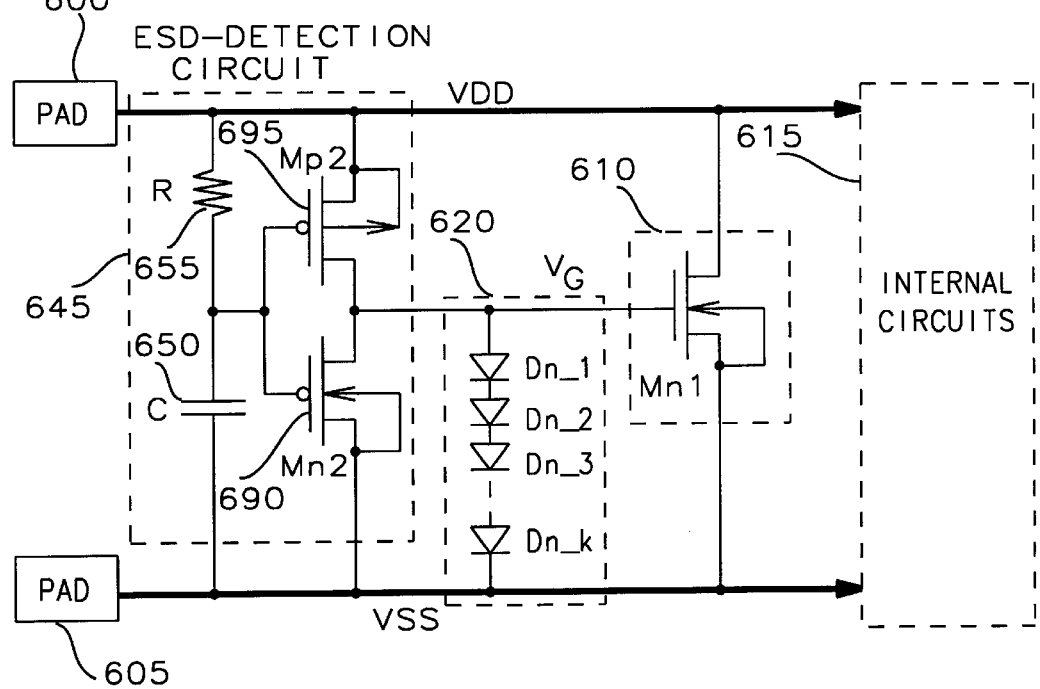

The voltage clamping circuit is shown in FIG. 34 as a plurality of diodes D_1, D_2, D_3, . . . , D_k serially connected cathode to anode. Each of the plurality of serially connected diodes D_1, D_2, D_3, . . . , D_k may be implemented, as described herein above, as an NMOS transistor or a PMOS transistor having a commonly connected gate and drain to force diode operation. Further, as described before, the number of diodes in the plurality of diodes should be sufficient to guarantee that the voltage level of the activation signal is greater than the threshold voltage VT of the charge dissipating NMOS transistor Mn1 and less than the voltage that will create the above-described surface channel in the charge dissipating NMOS transistor Mn1.

Figure 35:
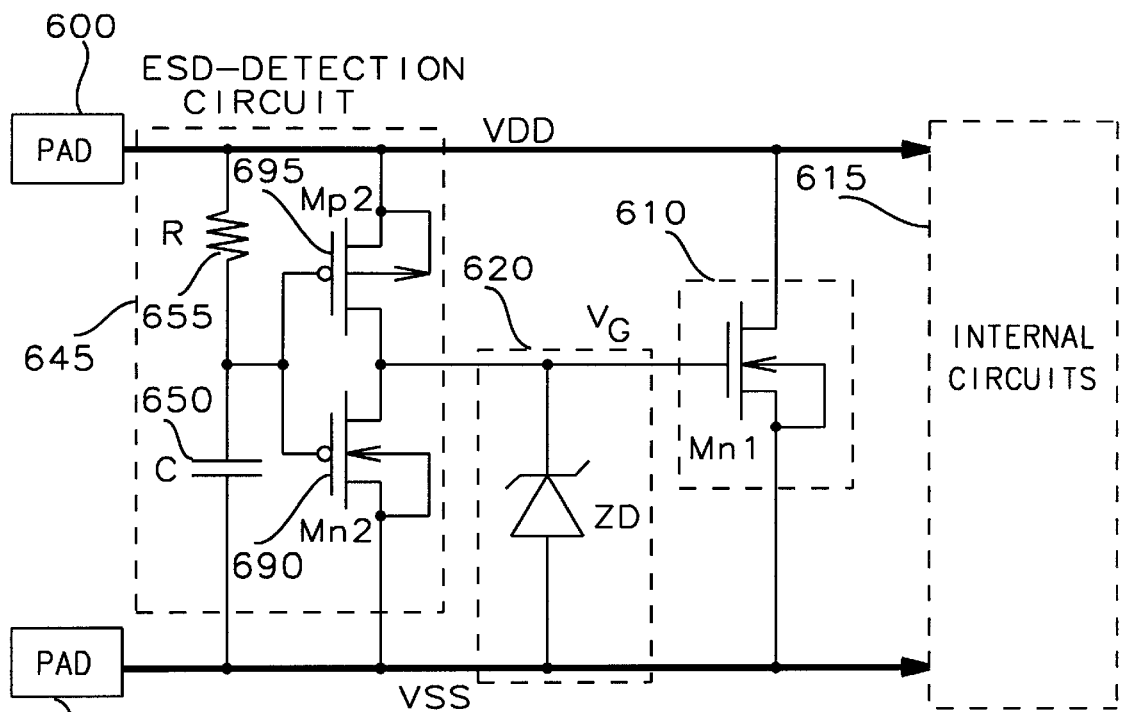

In FIG. 35, the voltage clamping circuit 620 is implemented as a zener diode ZD. The avalanche breakdown voltage of the zener diode ZD is established to be less than the voltage to establish the surface channel described above.

Figure 36:
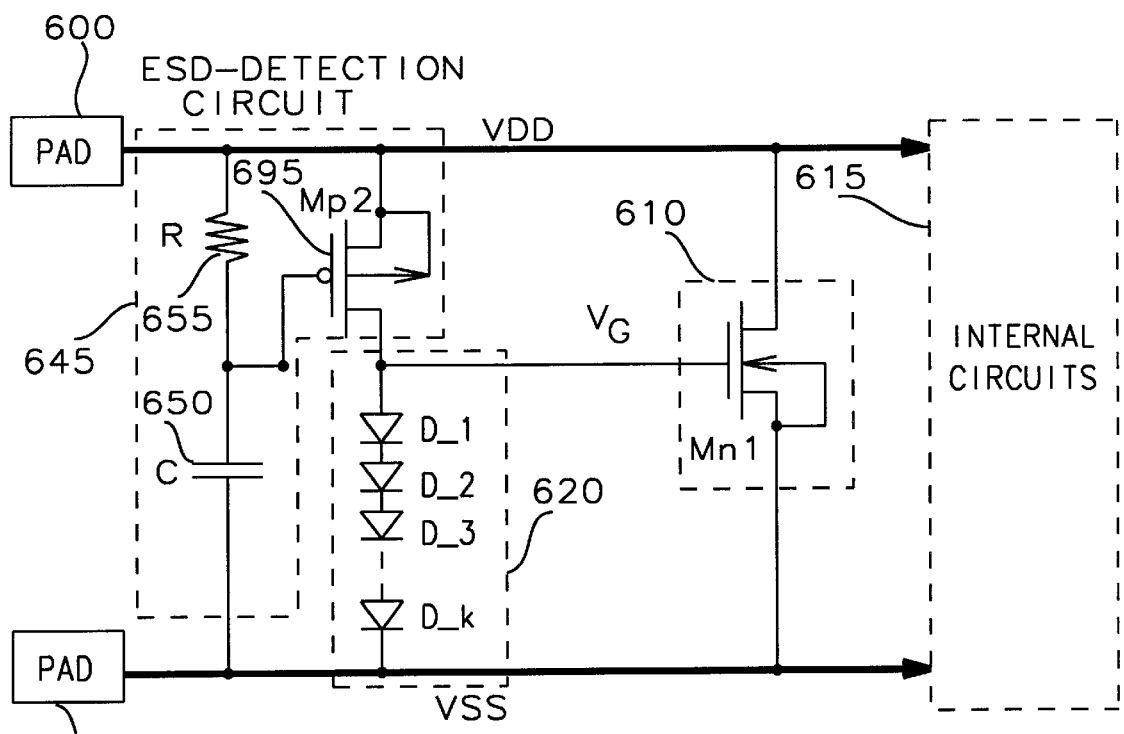
Figure 37:
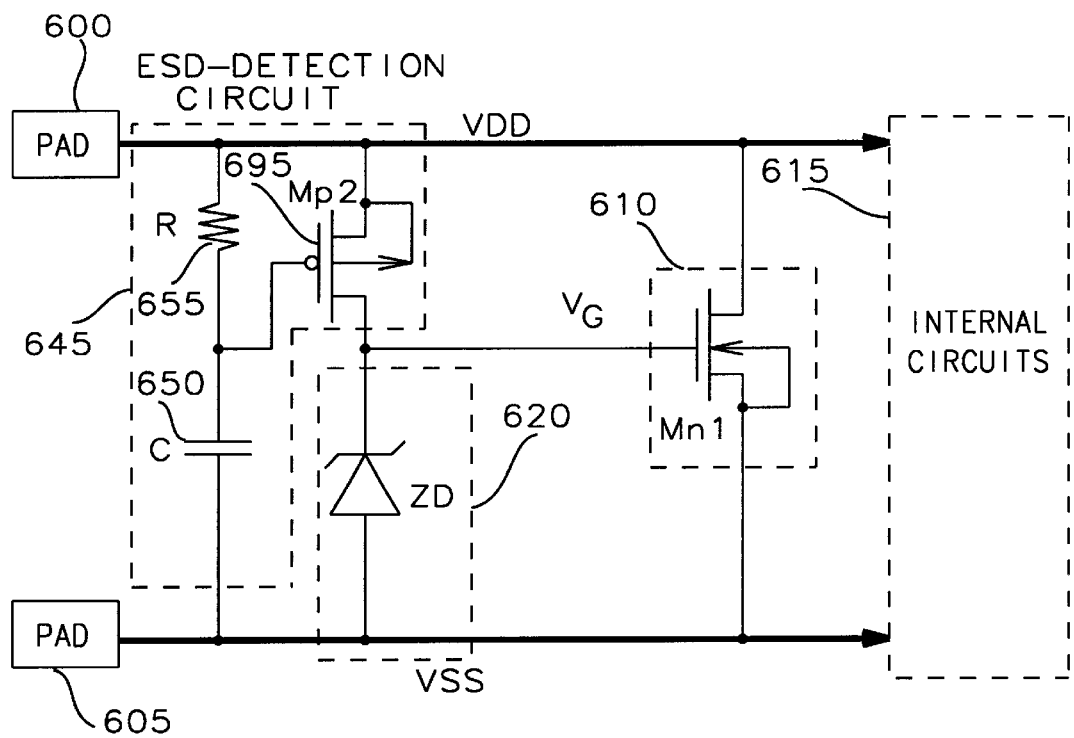

FIGS. 36 and 37 show a third embodiment of the ESD detection circuit 645. In this embodiment, the PMOS transistor Mp2 695 is structured to provide the activation signal to the output port VG of the ESD detection circuit 645. The source of the PMOS transistor Mp2 695 is connected to the power supply terminal 600 which is connected to the power supply voltage source VDD. The drain of the PMOS transistor Mp2 695 forms the output port VG of the ESD detection circuit 645. The gate of the PMOS transistor Mp2 695 is connected to the junction of the resistor R 655 and the capacitor C 650. The capacitor C 650 is connected to the second power supply terminal 605 and the resistor R 655 is connected to the first power supply terminal 600.

During normal operation, the charge dissipating NMOS transistor Mn1 is maintained in a non-conductive state because no current can flow through the voltage clamping circuit 620. When the ESD source is coupled between the first and second power supply terminals 600 and 605, the current is induced in the capacitor C 650 and the voltage developed across the resistor R 655 turns on the PMOS transistor Mp2 695 and applies the application signal as described above. The voltage clamping circuit 620 activates and the voltage level of the activation signal is maintained at a level less than the voltage level that causes the surface channel described in FIG. 7.

In FIG. 36, the voltage clamping circuit is the plurality of serially connected diodes D_1, D_2, D_3, . . . , D_k. As described before, each of the serially connected diodes D_1, D_2, D_3, . . . , D_k are formed of NMOS transistors and PMOS transistors having a commonly connected gate and drain. In FIG. 37, the voltage clamping circuit is implemented as the zener diode ZD.

Figure 38:
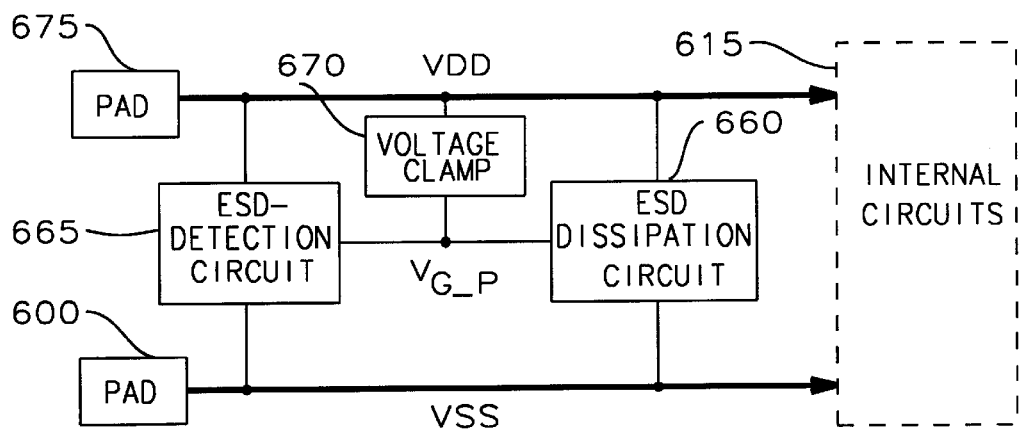

Illustrated in FIG. 38 is a variation of the fourth embodiment. In this embodiment, the ESD dissipation circuit 660 is connected between the first power supply terminal 600 that is connected in this case to the substrate biasing voltage source VSS and the third power supply terminal 675 that is connected to the power supply voltage source VDD. As described above, the ESD dissipation circuit 610, when activated, will allow a current to flow from the ESD source connected between the third power supply terminal 675 and the first power supply terminal 600 to dissipate any charge from the ESD source to prevent damage to the internal circuit 615 of the integrated circuits. The ESD detection circuit 665 has a first input port connected to the third power supply terminal 675 and a second input port connected to the first power supply terminal 600. When the ESD source is coupled between the third and first power supply terminals 675 and 600, the ESD detection circuit 675 places an activation signal at the output port VG_p to engage the ESD dissipation circuit 660.

As described above, the extreme voltage level of the ESD source causes the voltage level at the output port VG_p to be sufficiently excessive to cause damage to the ESD dissipation circuit 660. The voltage clamping circuit 670 is connected between the output port VG-p of the ESD detection circuit 645 and the third power supply terminal 675 that is connected to the power supply voltage source VDD. The voltage clamping circuit 670 prevents the voltage level at the output port VG_p of the ESD detection circuit 665 from exceeding a voltage level that will damage the ESD dissipation circuit 660.

Figure 39:
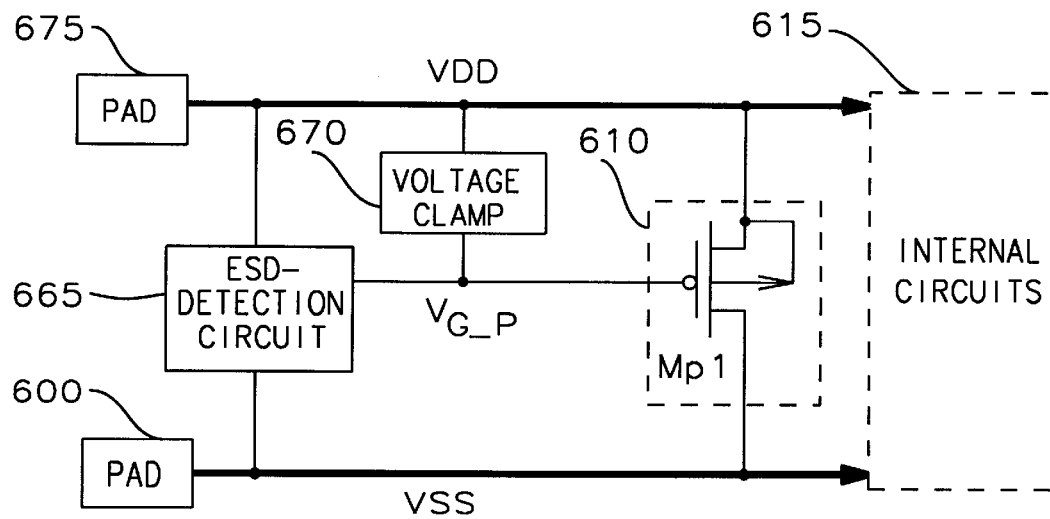

The ESD dissipation circuit 660, as shown in FIG. 39, is implemented as the PMOS transistor Mp1 having relatively large dimensions to accommodate the current necessary to dissipate the charge of the ESD source. The drain of the PMOS transistor Mp1 is connected to the third power supply terminal 675 that is connected to the power supply voltage source VDD and the source of the PMOS transistor Mp1 is connected to the first power supply terminal 600 that is connected to the substrate biasing voltage source VSS. The gate of the PMOS transistor Mp1 is connected to the output port VG_p of the ESD detection circuit 665.

If an ESD source having a positive polarity is coupled to the third power supply terminal 675 or an ESD source having a negative polarity is connected to the first power supply terminal 60, the ESD detection circuit 665 places the activation signal at the output port VG_p to turn on the PMOS transistor Mp1. The voltage clamping circuit 670 will prevent the activation signal from attaining a voltage level that will cause the surface channel that is analogous to the surface channel 135 of FIG. 7.

Figure 40:
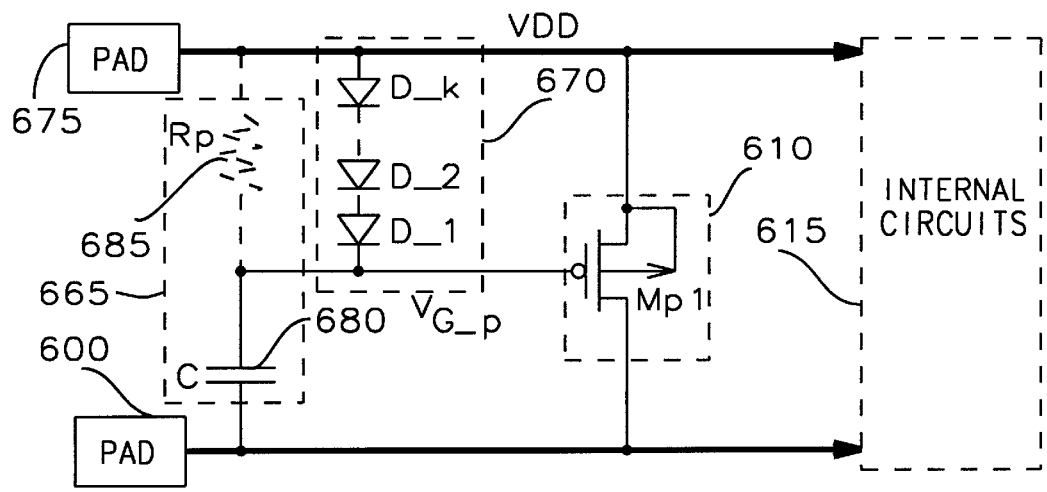

FIG. 40 illustrates an embodiment of the ESD detection circuit 665. The resistor R 685 is connected between the third power supply terminal 675 and the gate of the PMOS transistor Mp1. The capacitor C 680 is connected between the gate of the PMOS transistor Mp1 and the first power supply terminal 600.

When the ESD source is coupled between the first and second power supply terminals 600 and 605, a current is induced in the capacitor C 680. The current flows in the resistor R 685 to develop a voltage sufficient to turn on the PMOS transistor Mp1, thus creating the activation signal at the output port VG_p and turning on the ESD dissipation circuit 660.

It is apparent that the voltage level of the activation signal would approach the voltage level of the ESD source if it were not for the voltage clamping circuit 670 activating and fixing the voltage level of the activation signal.

The voltage clamping circuit 670, as shown, is a plurality of diodes D_1, D_2, D_3, ..., D_k serially connected cathode to anode. Each of the plurality of serially connected diodes D_1, D_2, D_3, ..., D_k may be implemented, again, as an NMOS transistor or a PMOS transistor having a commonly connected gate and drain to force diode operation. Further, again, the number of diodes in the plurality of diodes should be sufficient to guarantee that the voltage level of the activation signal is greater than the threshold voltage VT of the ESD protection PMOS transistor Mp1 and less than the voltage that will create the above-described surface channel in the ESD protection PMOS transistor Mp1.

Figure 41:
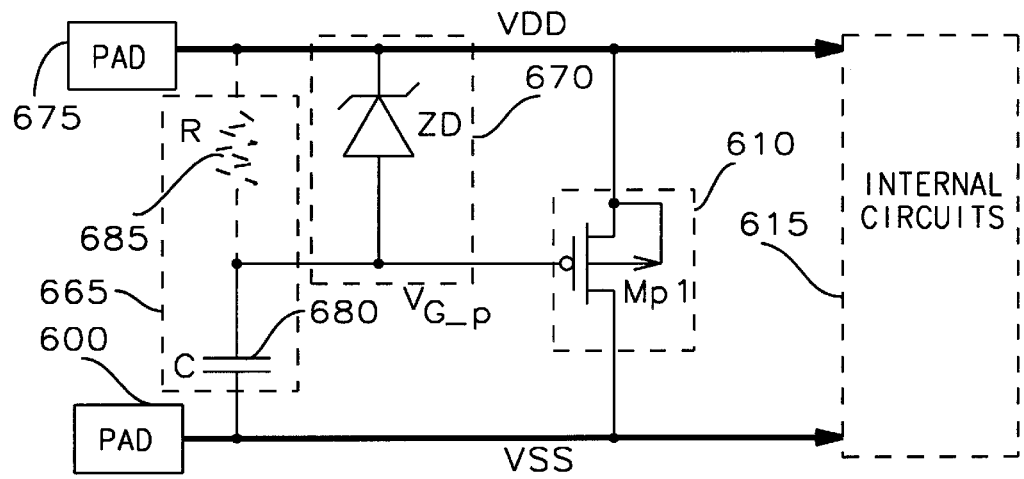

In FIG. 41, the voltage clamping circuit 670 is implemented as a zener diode ZD. The avalanche breakdown voltage of the zener diode ZD is established to be less than the voltage to establish the surface channel described above.

Additionally, in FIGS. 40 and 41 it should be noted that the resistor R 685 is optional. The voltage clamping circuit provides a path for the current induced in the capacitor C 680, when the ESD source is coupled between the third and first power supply terminals 675 and 600. This path through the voltage clamping circuit 670 is sufficient to develop the activation signal to turn on the ESD protection PMOS transistor Mp1.

Figure 42:
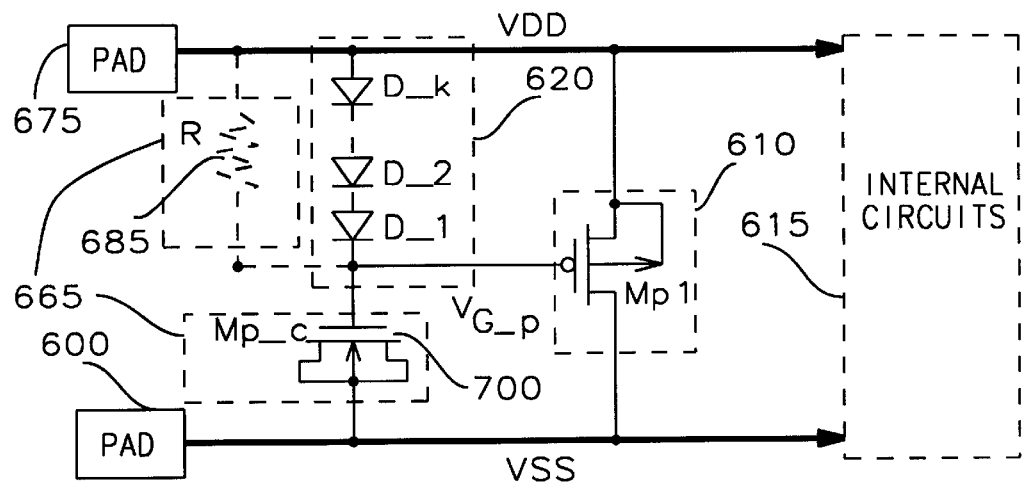

In FIG. 42, the capacitor Mp_c 700 and the resistor R 685 form the ESD detection circuit 665. The capacitor Mp_c 700 functions as the capacitor C 680 of FIGS. 40 and 41 but is formed from a MOS transistor having its gate connected to the output port VG_p of the ESD detection circuit 665. The source, drain and semiconductor bulk are commonly connected together and to the first power supply terminal 600 that is connected to the substrate biasing voltage source VSS.

It will be apparent that the capacitor Mp_c 700 can be used in the other embodiments of this invention to form the capacitor of the ESD detection circuits.

While this invention has been particularly shown and described with reference to the preferred embodiments thereof, it will be understood by those skilled in the art that various other changes and combinations in form and details may be made without departing from the spirit and scope of the invention.

The invention claimed is:

1. An ESD protection circuit connected between a first terminal and a second terminal of an integrated circuit for dissipating an electrostatic charge from an ESD source coupled from the first terminal to the second terminal to protect said integrated circuit from damage caused by exposure to extreme voltage from said ESD source, whereby said ESD protection circuit comprises:

a charge dissipation means for shunting said electrostatic charge from integrated circuit, having a first port connected to the first terminal, a second port connected to the second terminal, and a third port;

an ESD detection means having a first input port connected to the first terminal, a second input port connected to the second terminal, and an output port connected to the third port of the charge dissipation means, whereby in detecting a presence of said electrostatic charge, said ESD detection means generates an excess voltage at said third port that will damage the charge dissipation means; and a voltage clamping means connected between the third port of the charge dissipation means and the second terminal to prevent the generation of the excess voltage at the third port of the charge dissipation means.

2. The ESD protection circuit of claim 1 wherein the charge dissipation means is a MOS transistor having a source connected to the first port, a drain connected to the second port, and a gate connected to the third port.

3. The ESD protection circuit of claim 1 wherein the first terminal is a voltage terminal of a power supply voltage source and the second terminal is an input signal terminal of the integrated circuit.

4. The ESD protection circuit of claim 1 wherein the first terminal is a reference terminal of a power supply voltage source and the second terminal is an input signal terminal of the integrated circuit.

5. The ESD protection circuit of claim 1 wherein the first terminal is a voltage terminal of a power supply voltage source and the second terminal is reference terminal of the power supply voltage source.

6. The ESD protection circuit of claim 1 wherein the ESD detection means comprises a capacitor connected between the first input port and the output port of the ESD detection means.

7. The ESD protection circuit of claim 6 wherein the ESD detection means further comprises a resistor connected between the output port and the second input port of the ESD detection means.

8. The ESD protection circuit of claim 1 wherein the voltage clamping means comprises a plurality of diodes serially connected cathode to anode between the output port of the ESD detection means and the second terminal.

9. The ESD protection circuit of claim 8 wherein the diodes are MOS transistors having commonly connected gates and drains.

10. The ESD protection circuit of claim 8 wherein the voltage clamping means is a zener diode having a cathode connected to the output port of the ESD detection means and an anode connected to the second terminal.

11. An ESD protection circuit connected between a first power supply terminal and a second power supply terminal of an integrated circuit formed on a semiconductor substrate for dissipating an electrostatic charge from an ESD source in contact with the first power supply terminal to protect said integrated circuits from damage caused by exposure to extreme voltage from said ESD source, whereby said ESD protection circuit is comprising;
  a charge dissipation means for shunting said electrostatic charge from said integrated circuit having a first port connected to the first power supply terminal, a second port connected to the second power supply terminal, and a third port;
  an ESD detection means having a first input port connected to the first power supply terminal, a second input port connected to the second power supply terminal, and an output port connected to the third port of the charge dissipation means, whereby in detecting the electrostatic charge, the ESD detection means generates an excess voltage at the third port of the charge dissipation means causing damage to said charge dissipation means;
  a voltage clamping means connected between the output port of the ESD detection means and the second power supply terminal to prevent the generation of the excess voltage at the third port of the charge dissipation means.

12. The ESD protection circuit of claim 11 wherein the charge dissipation means is a MOS transistor having a drain connected to the first power supply terminal, a source connected to the second power supply terminal, and a gate connected as the third port to the output port of the ESD detection means.

13. The ESD protection circuit of claim 11 wherein the ESD detection means comprises:
  a resistor having a first terminal connected to the first power supply terminal;
  a capacitor having a first plate connected to a second terminal of the resistor and a second plate connected to the power supply terminal; and
  a MOS transistor of a first conductivity type having a source connected to the first power supply terminal, a drain connected to the output port, and a gate connected to the connection of the first plate of the capacitor and the second terminal of the resistor.

14. The ESD protection circuit of claim 13 wherein the ESD detection circuit is further comprising a MOS transistor a second conductivity type having a drain connected to the output port, a source connected to the second power supply terminal, and a gate connected to the common connection of the first plate of the capacitor and the second terminal of the resistor.

15. The ESD protection circuit of claim 11 wherein the voltage clamping means is comprising a plurality of diodes serially connected cathode to anode between the output port of the ESD detection means and the second power supply terminal.

16. The ESD protection circuit of claim 15 wherein the diodes are each a MOS transistor having a commonly connected gate and drain.

17. The ESD protection circuit of claim 11 wherein the voltage clamping circuit is comprising a zener diode having a cathode connected to the output pad of the ESD detecting mean and an anode connected to the second power supply terminal.

18. An ESD protection circuit connected between a first power supply terminal, a second power supply terminal, and an input/output signal terminal of an integrated circuit formed on a semiconductor substrate for dissipating an electrostatic charge from an ESD source connected to the input/output signal terminal to protect said integrated circuit from damage caused by exposure to extreme voltage from the ESD source, whereby said ESD circuit comprises:
  a first charge dissipation means for shunting said electrostatic charge having a first charge polarity from said integrated circuit, having a first port connected to the first power supply terminal, a second port connected to the input/output signal terminal, and a third port;
  a second charge dissipation means for shunting said electrostatic charge of a second charge polarity from said integrated circuit, having a fourth port connected to the second power supply terminal, a fifth port connected to the input/output signal terminal, and a sixth port;
  a first ESD detection circuit having a first input port connected to said first power supply terminal, a second input port connected to said input/output signal terminal, and a first output port connected to the third port, whereby in detecting the electrostatic charge of the first polarity, said first ESD detection means will generate a first excess voltage that will damage the first ESD charge dissipation means;
  a second ESD detection means having a fourth input port connected to the second power supply terminal, a fifth input port connected to the input/output signal terminal, and a second output terminal connected to the sixth port, whereby in detecting the electrostatic charge of the second polarity, said second ESD detection means will generate a second excess voltage that will damage the second ESD detection means;
  a first voltage clamping means connected between the third port of the first charge dissipation means and the first power supply terminal to prevent generation of the first excess voltage at the third port of the first charge dissipation means; and
  a second voltage clamping means connected between the sixth port of the second charge dissipation means and the second power supply terminal to prevent generation of the second excess voltage at the sixth port of the second charge dissipation means.

19. The ESD protection circuit of claim 18 wherein the first charge dissipation means is a MOS transistor of a first conductivity type having a drain connected to the input/ output signal terminal, a source connected to the first power supply terminal, and a gate connected to the third port of the first charge dissipation means.

20. The ESD protection circuit of claim 18 wherein the second charge dissipation means is a MOS transistor of the second conductivity type having a drain connected to the input/output signal terminal, a source connected to the second power supply terminal, and a gate connected to the sixth port of the second charge dissipation means.

21. The ESD protection circuit of claim 18 wherein the first ESD detection circuit comprises a first capacitor connected between the third port of the charge dissipation means and the input/output signal terminal.

22. The ESD protection circuit of claim 21 wherein the first ESD detection circuit is further comprising a first resistor connected between the third port of the charge dissipation means and the first power supply terminal.

23. The ESD protection circuit of claim 18 wherein the second ESD detection circuit comprises a second capacitor connected between the sixth port of the charge dissipation means and the input/output signal terminal.

24. The ESD protection circuit of claim 23 wherein the second ESD detection circuit is further comprising a second resistor connected between the sixth port of the second charge dissipation means and the second power supply terminal.

25. The ESD protection circuit of claim 18 wherein the first voltage clamping means is comprising a first plurality of diodes serially connected cathode to anode between the output terminal of the first ESD detection means and the first power supply terminal.

26. The ESD protection circuit of claim 25 wherein the diodes are MOS transistor having commonly connected drains and gates.

27. The ESD protection circuit of claim 18 wherein the first voltage clamping means is comprising a first zener diode having a cathode connected to the output terminal of the first ESD detection means and an anode is connected to the first power supply terminal.

28. The ESD protection circuit of claim 18 wherein the second voltage clamping means is a second plurality of diodes serially connected cathode to anode between the output terminal of the second ESD detection means and the second power supply terminal.

29. The ESD protection circuit of claim 18 wherein the diodes are MOS transistors having commonly connected gates and drains.

30. The ESD protection circuit of claim 18 wherein the second voltage clamping means is comprising a zener diode having a cathode connected to the output terminal of the second ESD detection means and an anode connected to the second power supply terminal.

31. An integrated circuit output driver circuit for transferring digital signals from internal circuits to an output pad connected to a transmission medium and for dissipating electrostatic charge from an ESD source connected to the output pad, whereby said output driver circuit is comprising:

a driver means connected between a first power supply terminal and a second power supply terminal, and to the output pad to provide current to and to accept current from the transmission medium and to dissipate the electrostatic charge when the ESD source is connected to said output pad;

a first and second signal input terminal to connect the internal circuits to the driver means;

a first ESD detection circuit connected between the output pad and the first signal input terminal to detect the electrostatic charge when it is of a first plurality and to provide a first signal to activate the driver means to dissipate the electrostatic charge, whereby in detecting said electrostatic charge, said first ESD detection circuit generates a first excess voltage at said first signal input terminal that will damage said driver means;

a second ESD detection circuit connected between the output pad and the second signal input terminal to detect the electrostatic charge when it is of a second polarity and activate the driver means to dissipate the electrostatic charge, whereby in detecting the electrostatic charge of the second polarity, said second ESD detection circuit generates a second excess voltage that will damage the said driver means;

a first voltage clamping means connected between the first signal input terminal and the first power supply terminal to prevent the generating of the first excess voltage; and a second voltage clamping means connected between the second signal input terminal and the second power supply terminal to prevent the generating of the second excess voltage.

32. The output driver circuit of claim 31 wherein the driver means is comprising:

a MOS transistor of a first conductivity type having a source connected to the first power supply terminal, a gate connected to the first signal input terminal, and a drain connected to the output pad; and a MOS transistor of a second conductivity type having a source connected to the second power supply terminal, a gate connected to the second signal input terminal, and a drain connected to the output pad.

33. The output driver circuit of claim 31 wherein the first ESD detection circuit comprises a first capacitor connected from the output pad to the first signal input terminal.

34. The output driver circuit of claim 31 wherein the second ESD detection circuit is comprising a second capacitor connected from the output pad to the second signal input terminal.

35. The output driver circuit of claim 31 wherein the first voltage clamping means comprises a first plurality of diodes serially connected cathode to anode between the first signal input terminal and the first power supply terminal.

36. The output driver circuit of claim 35 wherein the diodes are MOS transistors having commonly connected gates and drains.

37. The output driver circuit of claim 31 wherein the second voltage clamping means comprises a second plurality of diodes serially connected cathode to anode between the second signal input terminal an d the second power supply terminal.

38. The output driver circuit of claim 37 wherein the diodes are MOS transistors having commonly connected gates and drains.

* * * * *